(12) United States Patent
Chakravarty et al.

(10) Patent No.: US 11,257,560 B2
(45) Date of Patent: Feb. 22, 2022

(54) TEST ARCHITECTURE FOR DIE TO DIE INTERCONNECT FOR THREE DIMENSIONAL INTEGRATED CIRCUITS

(71) Applicant: Intel Corporation, Santa Clara, CA (US)

(72) Inventors: Sreejit Chakravarty, San Jose, CA (US); Fei Su, Folsom, CA (US); Puneet Gupta, San Jose, CA (US); Wei Ming Lim, Bayan Lepas (MY); Terrence Huat Hin Tan, Georgetown (MY); Amit Sanghani, San Jose, CA (US); Anubhav Sinha, Hyderabad (IN); Sudheer V Badana, Srikakulam (IN); Rakesh Kandula, Bengaluru (IN); Adithya B. S., Bengaluru (IN)

(73) Assignee: INTEL CORPORATION, Santa Clara, CA (US)

( * ) Notice: Subject to any disclaimer, the term of this patent is extended or adjusted under 35 U.S.C. 154(b) by 882 days.

(21) Appl. No.: 15/717,721

(22) Filed: Sep. 27, 2017

(65) Prior Publication Data

US 2019/0096503 A1    Mar. 28, 2019

(51) Int. Cl.
*G11C 29/12*    (2006.01)
*G11C 29/48*    (2006.01)
(Continued)

(52) U.S. Cl.
CPC ........ *G11C 29/1201* (2013.01); *G11C 29/025* (2013.01); *G11C 29/48* (2013.01);
(Continued)

(58) Field of Classification Search
CPC ... G11C 29/1201; G11C 29/025; G11C 29/48; H01L 23/5384; H01L 23/5385;
(Continued)

(56) References Cited

U.S. PATENT DOCUMENTS

| 6,249,893 | B1 * | 6/2001 | Rajsuman | G01R 31/318385 |
| | | | | 714/738 |
| 2006/0221842 | A1 * | 10/2006 | Terry | H04L 1/244 |
| | | | | 370/248 |

(Continued)

OTHER PUBLICATIONS

IEEE Std 802.11-2016: "Part 11: Wireless LAN Medium Access Control (MAC) and Physical Layer (PHY) Specifications," IEEE Standard for Information technology-Telecommunications and information exchange between systems, Local and metropolitan area networks-Specific requirements, Dec. 7, 2016, 3534 pages.

(Continued)

*Primary Examiner* — Clayton E. LaBalle
*Assistant Examiner* — Michael A Harrison
(74) *Attorney, Agent, or Firm* — Nicholson, De Vos, Webster & Elliott, LLP

(57) ABSTRACT

A die-to-die repeater circuit includes a transmit circuit coupled to a die-to-die interconnect, the transmit circuit including at least one flip flop to function as a part of a linear feedback shift register (LFSR) to transmit a value across the die-to-die interconnect for design for test (DFT) to check proper operation of the die-to-die interconnect, and a receive circuit coupled to the die-to-die interconnect, the receive circuit including at least one flip flop to function as part of a multiple input shift register (MISR).

9 Claims, 18 Drawing Sheets

Face-to-Face Bonding

(51) Int. Cl.
| | |
|---|---|
| *H01L 23/538* | (2006.01) |
| *H03K 17/56* | (2006.01) |
| *H03K 17/00* | (2006.01) |
| *G11C 29/50* | (2006.01) |
| *G11C 29/02* | (2006.01) |
| *H01L 25/065* | (2006.01) |
| *H01L 23/00* | (2006.01) |

(52) U.S. Cl.
CPC .......... *G11C 29/50* (2013.01); *H01L 23/5384* (2013.01); *H01L 23/5385* (2013.01); *H03K 17/002* (2013.01); *H03K 17/56* (2013.01); *H01L 24/16* (2013.01); *H01L 24/17* (2013.01); *H01L 25/0657* (2013.01); *H01L 2224/13025* (2013.01); *H01L 2224/16145* (2013.01); *H01L 2224/16227* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01)

(58) Field of Classification Search
CPC ..... H01L 24/16; H01L 24/17; H01L 25/0657; H01L 2224/13025; H01L 2224/16145; H01L 2224/17181; H01L 2225/06513; H01L 2225/06517; H03K 17/002; H03K 17/56
See application file for complete search history.

(56) References Cited

U.S. PATENT DOCUMENTS

| | | | | |
|---|---|---|---|---|
| 2012/0137186 A1* | 5/2012 | Portolan | ........ | G01R 31/318558 714/727 |
| 2014/0053003 A1* | 2/2014 | Moyer | ................ | G06F 21/556 713/300 |
| 2014/0053035 A1* | 2/2014 | Harper | ............... | G01R 31/3187 714/733 |

OTHER PUBLICATIONS

IEEE Std 802.11a-1999(R2003): "Part 11: Wireless LAN Medium Access Control (MAC) and Physical Layer (PHY) Specifications, High-speed Physical Layer in the 5 GHz Band," IEEE Standard for Information technology—Telecommunications and information exchange between systems, Local and metropolitan area networks—Specific requirements, reaffirmed Jun. 12, 2003, copyright 1999, 91 pages.
IEEE Std 802.11ac-2013 "Part 11: Wireless LAN Medium Access Control (MAC) and Physical Layer (PHY) Specifications, Amendment 4: Enhancements for Very High Throughput for Operation in Bands below 6 GHz," IEEE Standard for Information technology—Telecommunications and information exchange between systems, Local and metropolitan area networks—Specific requirements, Dec. 18, 2013, 425 pages.
IEEE Std. 802.11b-1999: "Higher Speed Physical Layer (PHY) Extension in the 2.4 GHz Band," IEEE Standard for Information Technology, Telecommunications and information exchange between systems, Local and Metropolitan networks, Specific requirements, Part 11: Wireless LAN Medium Access Control (MAC) and Physical Layer (PHY) specifications, Sep. 16, 1999, 96 pages.
IEEE Std 802.11g-2003: "Part 11: Wireless LAN Medium Access Control (MAC) and Physical Layer (PHY) Specifications, Amendment 4: Further Higher Data Rate Extension in the 2.4 GHz Band," IEEE Standard for Information technology—Telecommunications and information exchange between systems, Local and metropolitan area networks—Specific requirements, Jun. 27, 2003, 78 pages.
IEEE Std 802.11n-2009: "Part 11: Wireless LAN Medium Access Control (MAC) and Physical Layer (PHY) Specifications, Amendment 5: Enhancements for Higher Throughput," IEEE Standard for Information technology—Telecommunications and information exchange between systems, Local and metropolitan area networks—Specific requirements, Oct. 29, 2009, 536 pages.
JEDEC Standard, "Low Power Double Data Rate 2 (LPDDR2)," JESD209-2E (Revision of JESD209-2D, Dec. 2010), JEDEC Solid State Technology Association, Apr. 2011, 284 pages.
PCI Express® Base Specification Revision 3.0, Nov. 10, 2010, 860 pages.
TPM Main Part 1 "Design Principles," Specification Version 1.2, Revision 62, TCG Copyright, Oct. 2, 2003, 161 pages.
TPM Main Part 2 "TPM Structures," Specification Version 1.2, Revision 62, TCG Published, Oct. 2, 2003, 176 pages.
Wigig White Paper, Wireless Gigabit Alliance, Defining the Future of Multi-Gigabit Wireless Communications, Jul. 2010, 5 pages.

* cited by examiner

TEST ARCHITECTURE FOR DIE TO DIE INTERCONNECT FOR THREE DIMENSIONAL INTEGRATED CIRCUITS

TECHNICAL FIELD

Embodiments of the invention relate to the field of testing of integrated circuits (ICs); and more specifically, to a design for test (DFT) architecture to enable the testing of three dimensional (3D) ICs using die to die interconnects.

BACKGROUND

The design of integrated circuits (ICs) has grown increasingly complex over time as it pursues greater computational throughput, efficiency and reduced power consumption. Interconnect scaling is a major barrier to improvements in IC performance. Interconnect scaling is a dominant contributor to circuit latency and power consumption. Three-dimensional (3-D) integration, particularly stacked 3-D ICs, is one technology based response to overcome this barrier. Compared to traditional two=dimensional (2-D) ICs, 3-D stacked ICs have significantly smaller average interconnect length, i.e., the distance between discrete ICs that are communicatively connected through an interconnect, which is a communication medium. The use of 3-D stacked ICs provides shorter interconnect length. As a result of the shorter interconnect length the 3-D stacked ICs have reduced power consumption and smaller form factors in comparison to a 2-D IC with similar computational capabilities.

ICs are often formed on a die (pl. Dice), which is a block of semiconducting material on which a given IC can be fabricated. Dice can be designed using different technologies. These die fabrication technologies can be integrated using 3-D stacking of ICs thereby improving system integration efficiency. This may be applied with any computing architecture including system on a chip (SOC) architectures.

As illustrated in FIG. 1, there are two approaches to stacking dies in 3-D space, namely "face-to-face" (F2F) bonding and "face-to-back" (F2B) bonding. In F2B bonding, the outermost metal layer of one die (the face) is connected to the TSV (through-silicon via) on the substrate layer of the other die (the back). By contrast, F2F bonding connects the two dice's metal layer through micro-bump, and TSV is dedicated to connect any primary input/output (IO) to package bump. A 'bump' in this context refers to an interface often in a connection package for interfacing a die with a package or housing for an IC or between a packaged IC and a circuit board or another packaged IC.

However, the use of these 3-D stacked ICs presents a new difficulty in testing the operation of each of the stacked ICs and the interconnects between them. The difficulty of testing these interconnects is a major obstacle to adopting 3D IC integration. This is due to limited test access, as well as thermal and power constraints.

BRIEF DESCRIPTION OF THE DRAWINGS

The present disclosure is illustrated by way of example and not limitation in the figures of the accompanying drawings, in which like references indicate similar elements and in which.

DETAILED DESCRIPTION

Figure 1:
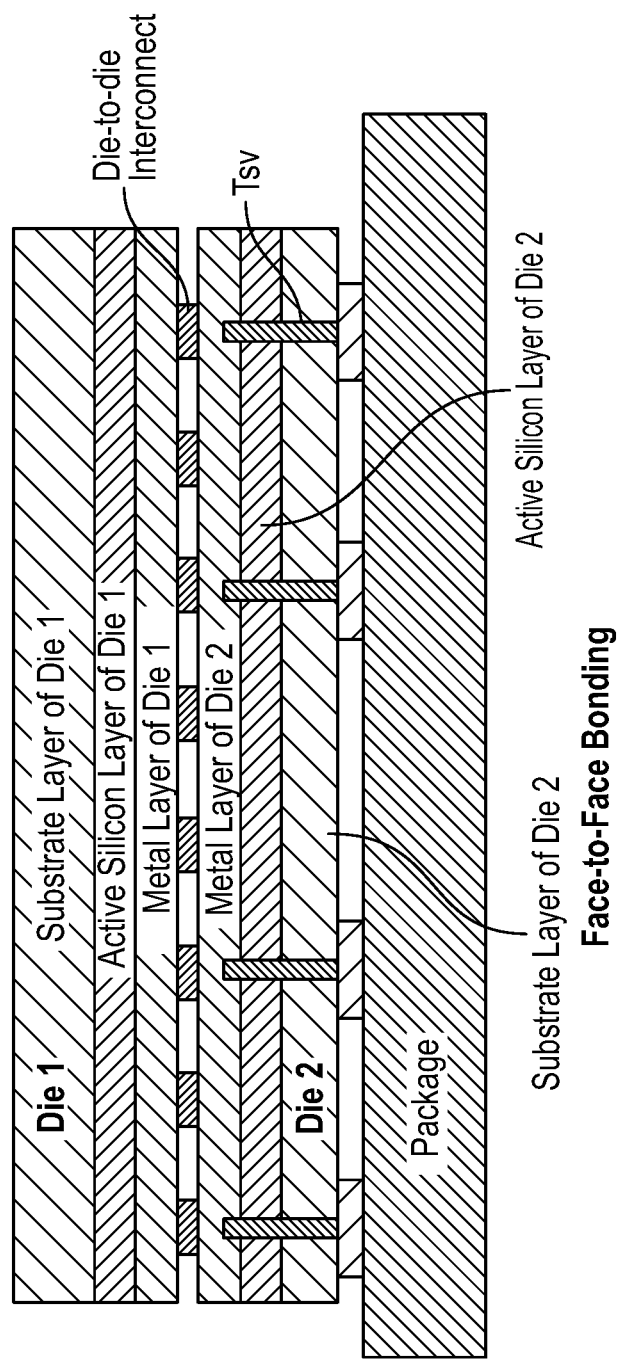
FIG. 1 is a diagram of one embodiment of a set of 3-D stacked IC bonding configuration, a face-to-face bonding and a face-to-back bonding.
Figure 1:
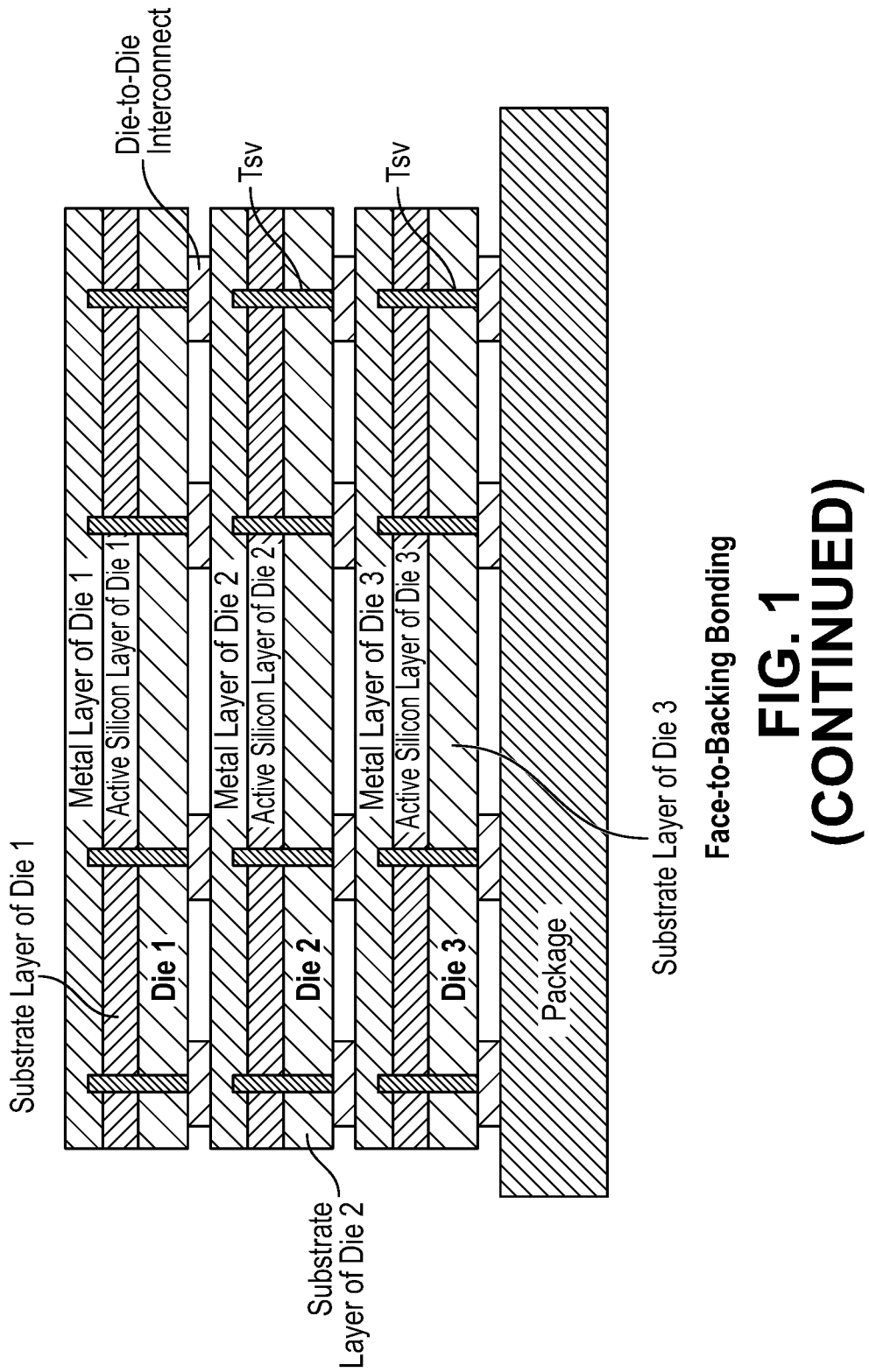

The embodiments provide a set of solutions to address the challenge of testing 3-D stacked integrated circuits (ICs) thereby facilitating wider spread adoption of 3-D IC integration. As used herein ICs refer to integrated circuits that may be processing circuits for specialized or generalized function or interconnects for transporting data and signals between processing circuits. The embodiments encompass several concepts for enabling testing of the 3-D stacked ICs. The embodiments optimize the design for test (DFT) area overhead, the standard boundary scan approach is not used. Instead, the embodiments encompass a technique of reusing the functional flops to emulate the boundary scan behavior. The embodiments include DFT logic that supports at-speed testing without using scan automatic test pattern generation (ATPG) or loopback. A linear feedback shift register (LFSR)/multiple input signature register (MISR) approach is used for at-speed testing. The embodiments include a DFT technique to support burn-in and parametric tests and the DFT infrastructure can support the use of joint test action group (JTAG) and internal JTAG (IJTAG).

In the following description, numerous specific details are set forth. However, it is understood that embodiments of the disclosure may be practiced without these specific details. In other instances, well-known circuits, structures, and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Electronics (e.g., computing systems) generally employ one or more electrical connections (e.g., wired or wireless connections) to facilitate the transmission and reception of data (e.g., communication) between devices, such as, but not limited to, between a computing system (e.g., a computer including a hardware processor) and a (e.g., external) peripheral. Non-limiting examples of peripherals are external storage devices (e.g., hard disk drives) and mobile devices (e.g., smartphones and tablets).

Computer architectures are moving from interfacing discrete components on a printed circuit board or through use of other package configurations, to integrating multiple components onto a single integrated chip, which is commonly referred to as a System on a Chip (SoC) architecture. SoCs offer a number of advantages, including denser packaging, higher speed communication between functional components, and lower temperature operation. SoC designs also provide standardization, scalability, modularization, and reusability.

SoC architectures present challenges with respect to verification of design and integration when compared with discrete components. For example, for many years personal computers employed the ubiquitous "North" bridge and "South" bridge architecture, wherein a central processing unit was interfaced to a memory controller hub (MCH) chip via a first set of buses, and the memory controller hub, in turn, was interfaced to an Input/Output controller hub (ICH) chip via another set of buses. Each of the MCH and ICH further provided interface to various system components and peripherals via further buses and interfaces. Each of these buses and interfaces adhere to well-established standards, enabling the system architectures to support modular designs. To ensure proper design, each of the individual or groups of components could be tested using test interfaces which are accessible through the device pins.

Modularity is also a key aspect of SoC architectures. Typically, the system designer will integrate various functional blocks, including functional blocks or components that are commonly referred to in the industry as Intellectual Property ("IP") cores, IP blocks, or simply IP. For the purposes herein, these functional blocks are referred to as IP blocks or simply "IP"; it will be understood that the terminology IP blocks or IP also covers IP cores and any other component or block generally known as IP, as would be understood by those in the SoC development and manufacturing industries. These IP blocks generally serve one or more dedicated functions and often comprise existing circuit design blocks that are licensed from various vendors or developed in-house. In order to integrate these IP blocks, various interfaces are designed into the SoC. These can be quite challenging, as the well-defined North bridge-South bridge architecture and its standardized interfaces are not practical or desirable for integration in the SoC.

Die-Die Interconnect DFT and Testing

The embodiments provide a DFT testing structure and processes to enable testing in 3-D stacked ICs. In particular, the embodiments enable testing the interconnects between the dice. This testing is adapted for the very short interconnect length between two dice. This interconnect between the two dice in a 3-D stacked IC utilizes a new type of Input/Output (IO) interface, called a die-die (or die to die) repeater (D2DR). The new D2DR differs from 2-D interconnect IOs in many aspects. The D2DR do not require IO training or compensation logic, which are present in standard 2-D interconnect IOs. Since in many 3-D stacked ICs, there are a large number of such D2DR (e.g., ~1000) packed densely in or around the center of the two or more dice, low power consumption is better for the testing of these interconnects. The testing of these interconnects also has to allow the 3-D stacked ICs to meet their performance targets. Thus, a low overhead DFT is provided by the embodiments.

Figure 2:
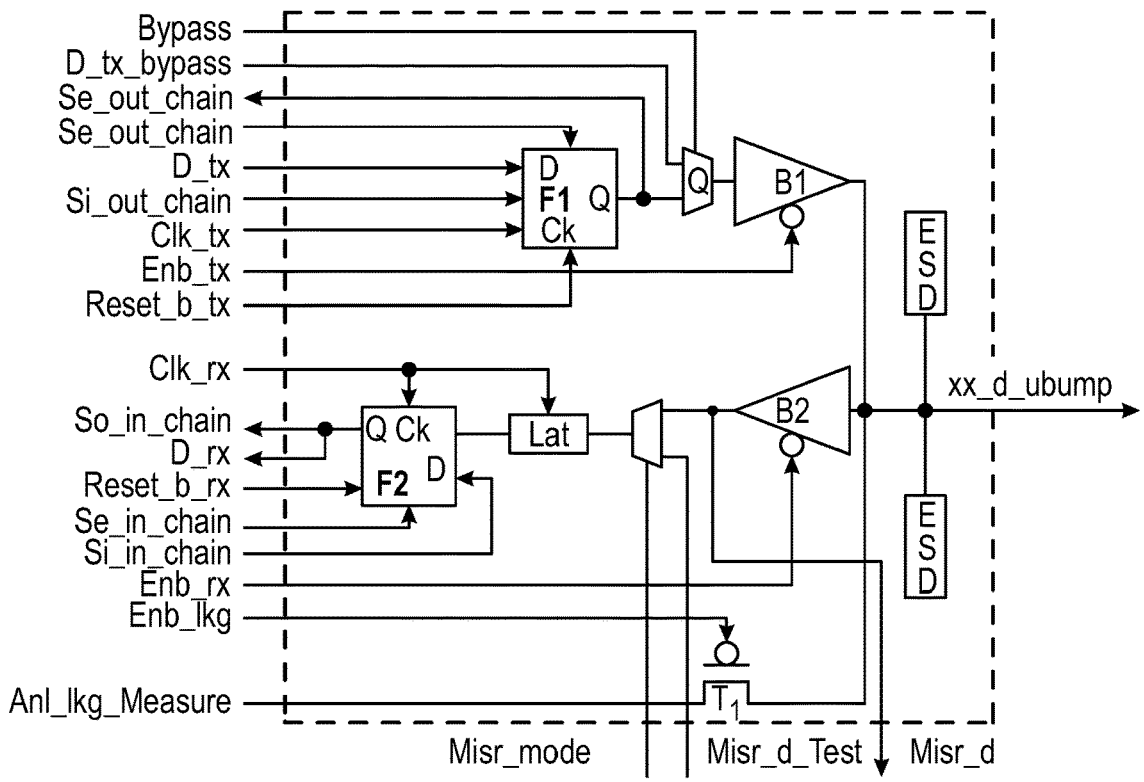
FIG. 2 is a diagram of one embodiment of a data die to die repeater cell.
Figure 3:
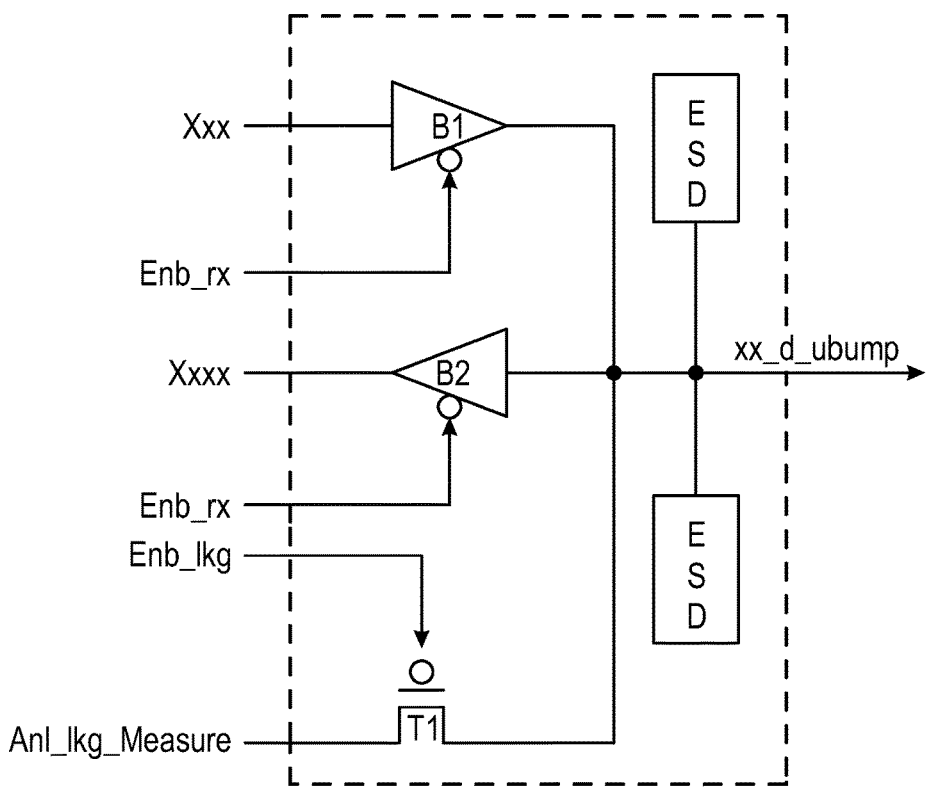
FIG. 3 is a diagram of one embodiment of a clock die to die repeater cell.

FIGS. 2 and 3 are diagrams of D2DR cells. There are two types of D2DR cells. FIG. 2 is an illustration of a Data D2DR cell and FIG. 3 is a diagram of a Clock D2DR cell. The data D2DR cells are used for data signals crossing the die boundary and each bit of data is registered at F1 (i.e., a D flip flop) at the transmit end and F2 (i.e., another D flip flop) at the receive end. In some embodiments, F1 and F2 are multiplexor-D scan flip flops. They are used in a source synchronous mode where the clocks to F1, F2 at each of the two ends of the associated interconnect are synchronized. The transmission circuitry including the F1 flip flow and the receive circuitry including the F2 flip flow utilize a single micro-bump (uBump).

The transmission circuitry can include a set of control inputs and a set of data inputs. These include an input d_tx which is the data bit to be transmitted, clk_tx is the clock for the transmission circuitry, enb_tx is the enable signal for the transmit buffer B1, which enables B1 to transmit. The cell also has a bypass mode in which D flip flop F1 is bypassed using the bypass signal via the multiplexor between the D flip flop and the buffer B1. In the bypass mode, bypass_d_tx is the data being transmitted by the transmission circuitry. The signals se_out, si_out, so_out are a part of the scan DFT interface for the output scan chain. Flip Flop F1 is part of this output scan chain. At the transmit end se_in, si_in, so_in are not used and se_in is tied off to 0.

Similarly, the receive circuitry includes a set of control inputs and a set of data outputs. The receive circuitry can also include a multiplexor, a latch (LAT), and a buffer B2 that are managed by the control inputs to determine the set of output signals for the receive circuitry based on the input signal received from the uBump. The input d_rx is the received data bits, the clk_rx signal is the clock for the receive circuitry, enb_rx is the enable signal for the receive buffer to receive data via the uBump. Signals se_in, si_in, so_in are a part of the scan DFT interface for the input scan chain. Flop F2 is part of the input scan chain. At the receive end, se_out, si_out, so_out are not used and se_out is tied to 0.

FIG. 3 is a diagram of the asynchronous (ASY) D2DR cell, which is used for clock and asynchronous signals crossing the die boundary. The ASY D2DR has a structure including a set of buffers B1 and B2 and transistor T1 that manage the transmission and receiving of asynchronous signals and a clock signal between the two dies across a uBump. This is a separate uBump than that of an associated data D2DR cell. Transmission or receiving of a signal via the uBump by either buffer B1 or B2, the d_tx and d_rx signals, respectively, is managed by the corresponding enable signals enb_tx and enb_rx. The transistor T1 similarly has an enable signal (enb_lkg) and data signal (anl_Lkg_measure).

Figure 4:
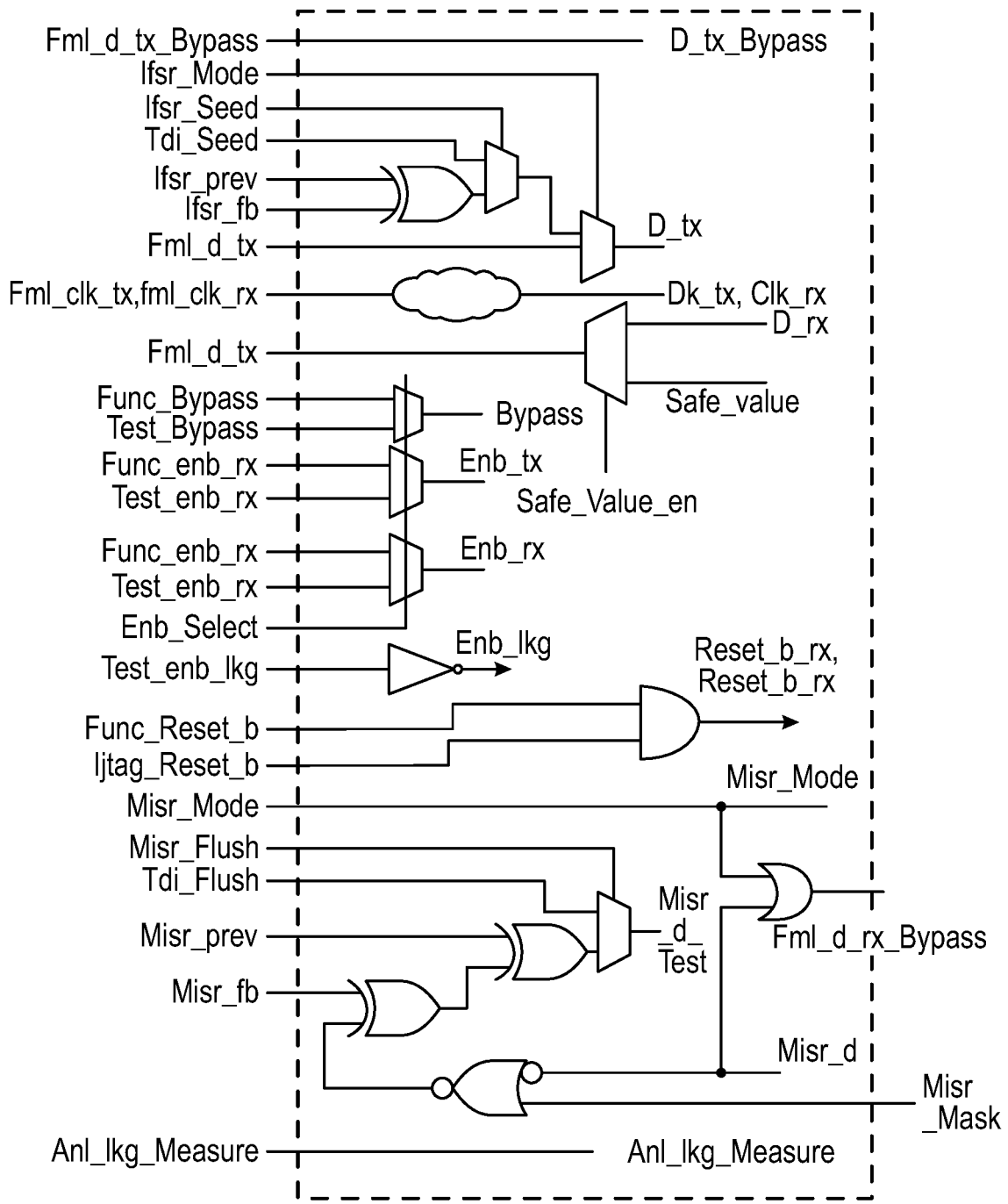
FIG. 4 is a diagram of DFT logic associated with a data D2DR cell.
Figure 4:
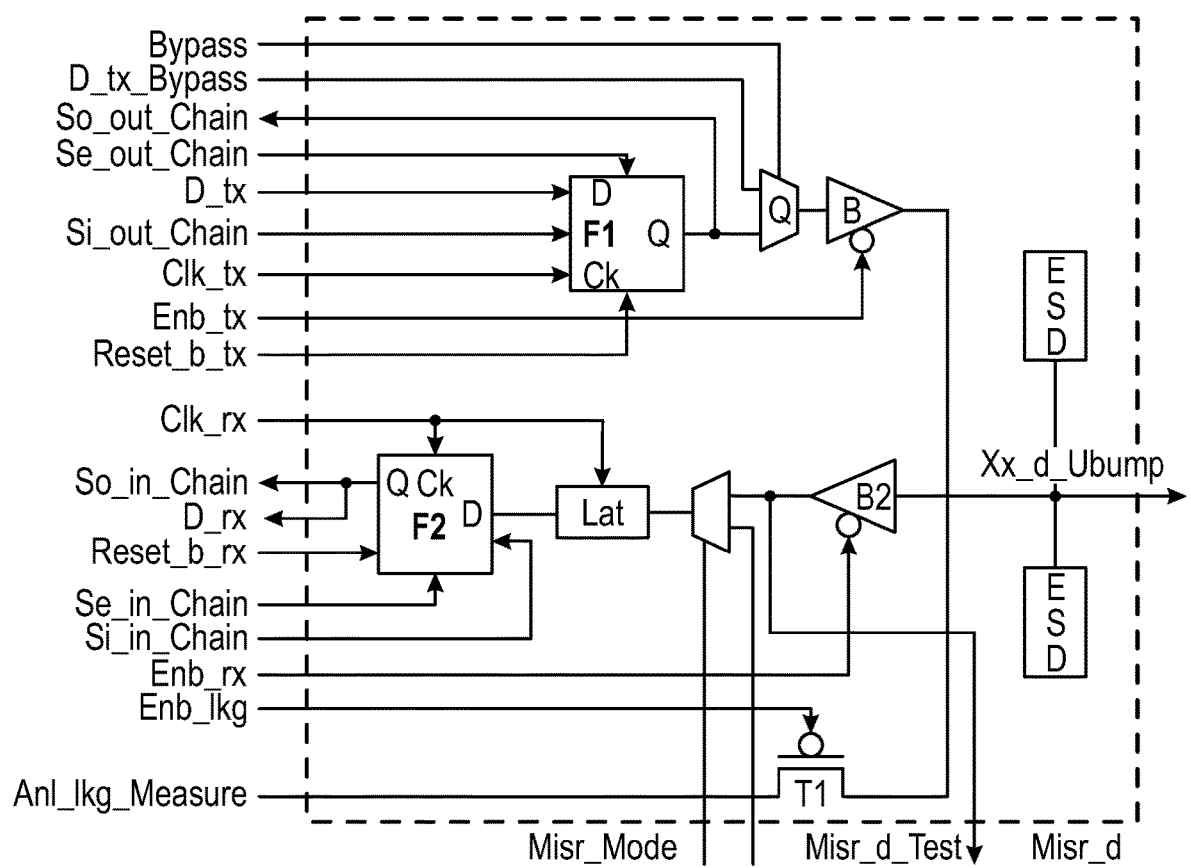

FIG. 4 is a diagram of DFT logic associated with a data D2DR cell. In one embodiment, the 3-D stacked IC is part of a system on a chip (SOC) or similar architecture. However, one skilled in the art would understand that the 3-D stacked IC technology can be applied with other computing architecture. In the SoC, a collection of D2DR cells may be assembled into a functional unit (e.g., an IP) called a family of uBumps or <FML>_uBump. Two copies of this IP may be instantiated on two sides of a uBump interconnect. This IP can support a functional, scan and/or iJtag interface. The IP may include the DFT logic on a per D2DR basis. The DFT logic for one data D2DR cell is shown in FIG. 4.

The DFT logic shown in FIG. 4 generates the data and control inputs and outputs for the data D2DRs. The DFT logic will configure the data D2DR into multiple modes for testing where flip flop F1 is configured to operate as: (i) an LFSR; (ii) a shift register to shift in the LFSR seed, perform a no touch leakage (NTL) test or similar test; and (iii) a flip flop for use in a functional mode. For this functional mode, the multiplexing structure with lfsr_mode and lfsr_seed control signals have been provided. The logical exclusive OR (XOR) gate, with its input is used to connect to other data D2DR cells to form an LFSR. Similarly, the multiplexing structure, along with misr mode and misr_flush control signals are provided to configure the F2 flip flop into: (i) a MISR; (ii) a shift register to read out the test result; or (iii) a flip flop for use in the functional mode. The enb_tx, enb_Tx, enb_lkg signals are used to disconnect respectively buffers B1, B2 and transistor T1 from the output node. These signals can be controlled in the functional mode (func_enb_tx, func_enb_Tx, func_enb_lkg) as well as the test mode (test_enb_tx, test_enb_Tx, test_end_lkg) using test select. The test_enb_tx, test_enb_rx, test_end_lkg and test select can all be controlled via test data register (TDR) bits. The LFSR/MISR configurations are used for at-speed as well as slow-speed testing. All the test control signals, defined above, are driven from a number of TDRs in an IJTAG infrastructure.

Figure 5:
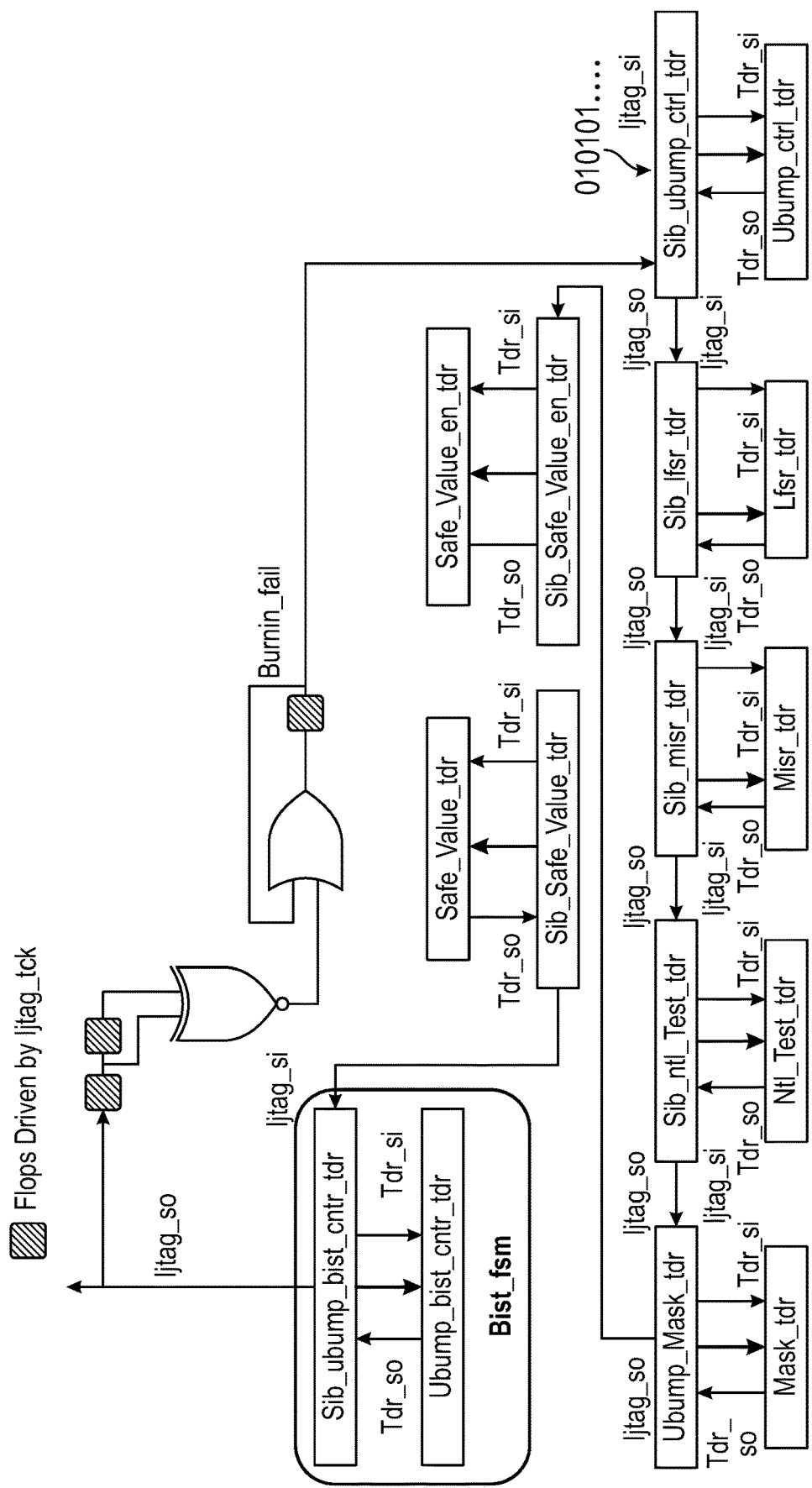
FIG. 5 is a diagram of one embodiment of an UTAG infrastructure for managing the DFT logic.

FIG. 5 is a diagram of one embodiment of an IJTAG infrastructure for managing the DFT logic. The illustration shows the TDRs in the IP and the IJTAG infrastructure. The IJTAG infrastructure may comply with Institute of Electrical and Electronics Engineers (IEEE) standards (e.g., JTAG 1149.x and IJTAG P1687). The JTAG and IJTAG standards define debug port implementation and communications via a test access port (TAP) including a protocol to access a set of test registers (e.g., the TDRs) that present IC logic levels and device capabilities of various functions of the ICs. The JTAG and/or IJTAG infrastructure can include a set of multi-input serial registers (MISRs) or similar registers. The MISRs are event-based intelligent signature accumulation blocks. The stored values may then be read out either by the CPU cores for internal comparison or by an external tester to compare against known good values and isolate bad units from good units. Similarly, other TDRs can include a MASK TDR, no-touch leakage (NTL) test TDR, a linear feedback shift register (LFSR) TDR, a uBump control (CNTRL) TDR and a uBump built-in self-test (BIST) control TDR.

The DFT logic associated with the clock (ASY) D2DR is similar and not shown. The ASY D2DR cell does not contain any flip flops. However, the DFT logic includes the F1, F2 flip flops to support slow-speed testing and NTL testing.

Figure 6:
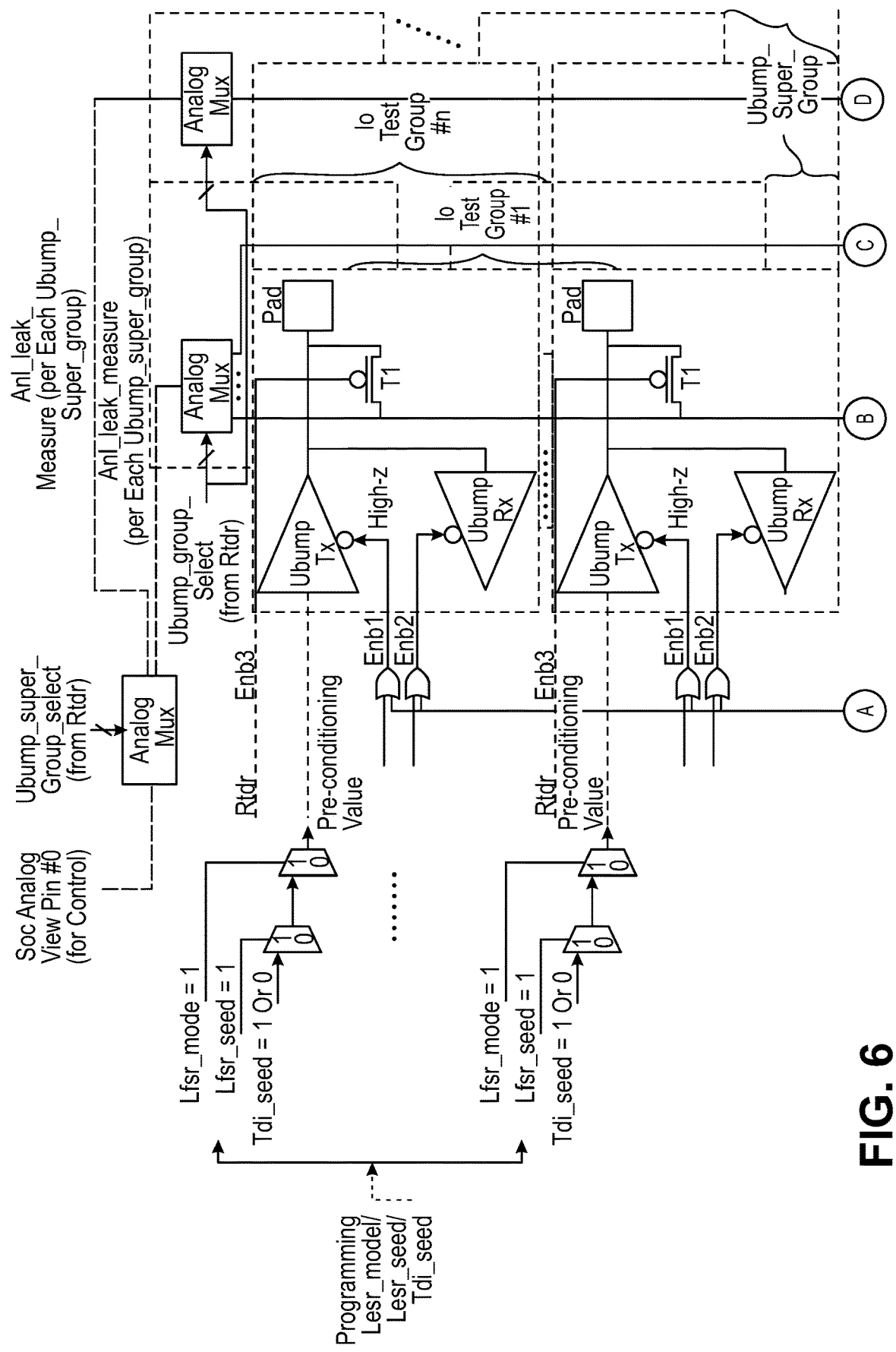
FIG. 6 is a diagram of one embodiment of DFT infrastructure for parametric testing.
Figure 6:
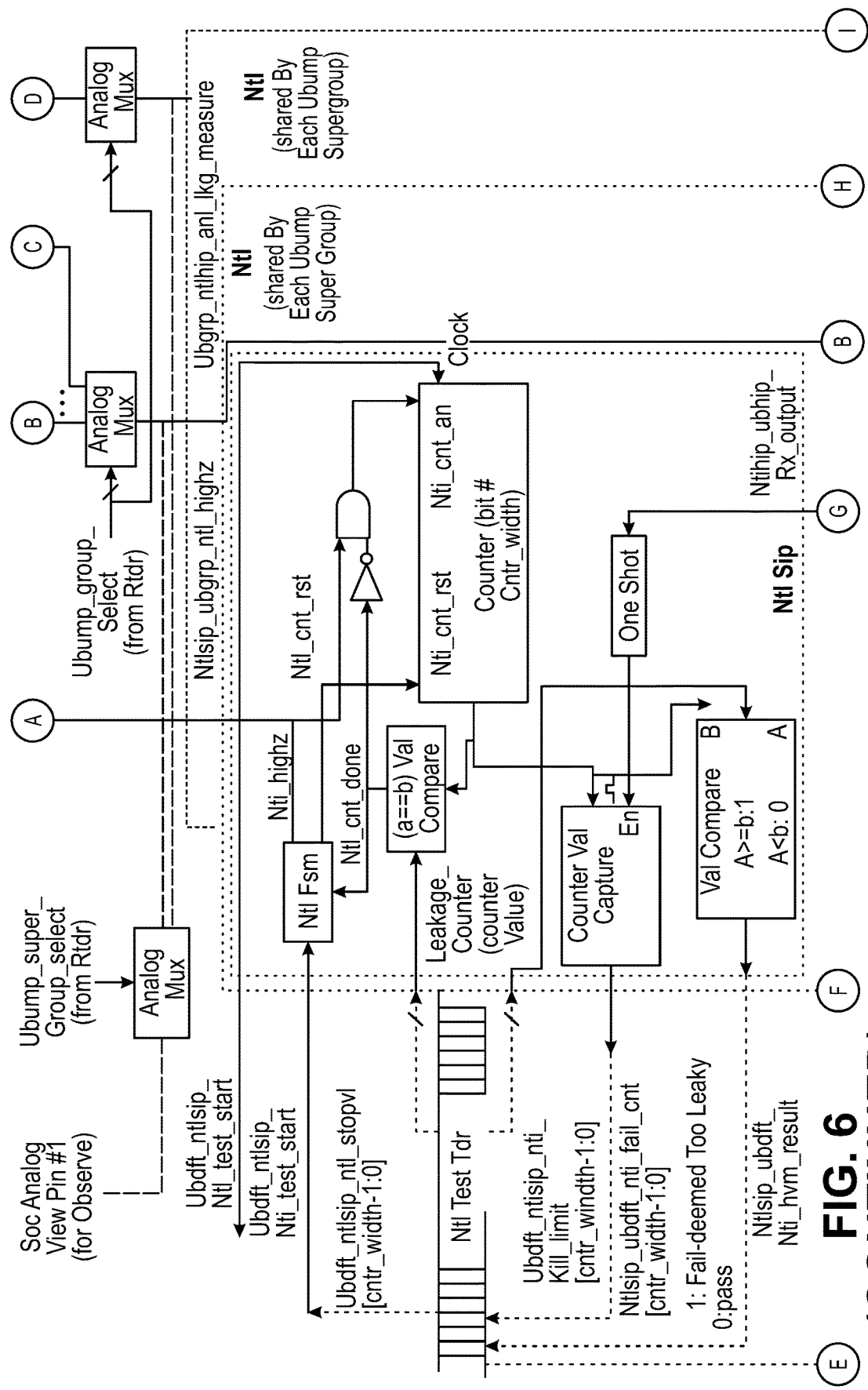
Figure 6:
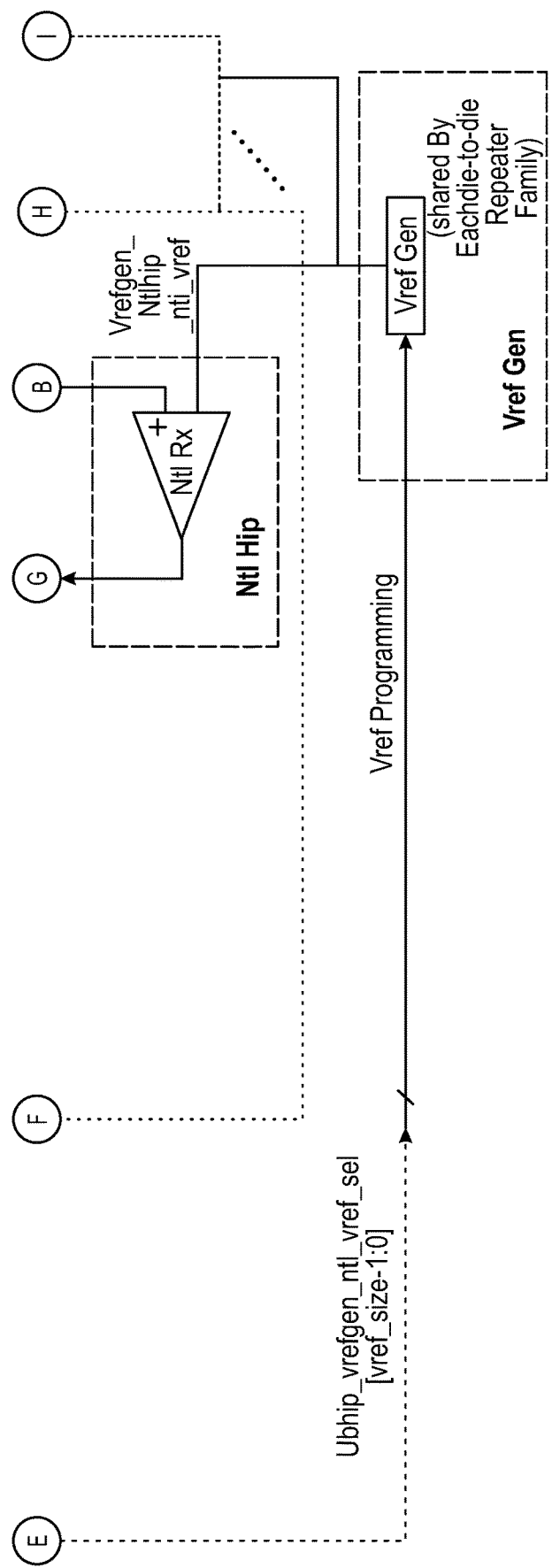

FIG. 6 is a diagram of one embodiment of DFT infrastructure for parametric testing. In this embodiment, there are no tester connections to the D2DR. A no-touch test (NTT) method is used to perform parametric testing of the D2DR. One example is a leakage test, which is used to detect any structural defects that cause a low resistive path from the D2DR pin to power and GND paths. DFT solution for D2DR leverages both RC decay method and ICDCT (In-Direct DC Test) method, with some novelty to address inter-die design requirement.

In the D2DR DFT logic, there is a provision to insert a safe_value when the two dice are not connected. This is required to test the individual die before packaging. As shown in FIG. 4, a multiplexor, along with a safe_value_en signal has been added. This signal is controlled from one of the TDRs shown in FIG. 5. The safe_value to be inserted during a test is also controlled from a TDR shown in FIG. 5.

In the D2DR DFT logic there is a provision to mask some of the bits of the MISR logic during a test. As shown in FIG. 4, a misr_mask bit is provided, along with the OR gate, to mask the misr_d input. The misrmask bit of an individual D2DR cell is controlled from one of the TDR bits of FIG. 5.

FIG. 6 shows the NTT architecture for D2DR. This embodiment provides a grouping of a number of D2DR cells into an uBump_Group. There is one No-Touch Leakage (NTL) block, consisting of an analog NTL RX comparator and an NTL digital logic, for each uBump_Group. NTL digital logic consists of a NTL finite state machine (FSM) and a counter. In an uBump_Group, each D2DR connects to an analog test bus (ATB) via a TDR controlled pass-gate (T1 of FIG. 2). ATB is an input to the analog NTL RX comparator. Reference voltage to the NTL RX comparator comes from a programmable VREF generator. There is one VREF generator per uBump family. In high volume manufacturing (HVM) screening, leakage of all D2DR cells is enabled by turning on T1 of all the D2DR simultaneously. For debugging purposes, the option of enabling the T1 of individual D2DR is provided. The ATB can be connected to SoC view pins, via analog multiplexors, for observation and control. Also, it can provide a way to characterize a reference voltage (Vref) generated on-die for the NTL RX comparator.

While the embodiments provide a DFT structure with minimum overhead, the embodiments do not lose sight of the manufacturing and screening capabilities needed to screen out defects to ensure high quality at the end of SORT (i.e. the testing of the bare, unpackaged die) and CLASS (i.e., when all the dice are packaged after stacking) tests. During the SORT test, the internal loopback path between the F1 flip flop and F2 flip flop of the same D2DR cell is used to perform both slow-speed and at-speed testing. For that, the F1 and F2 flip flops are configured respectively as LFSR and MISR.

Figure 7A:
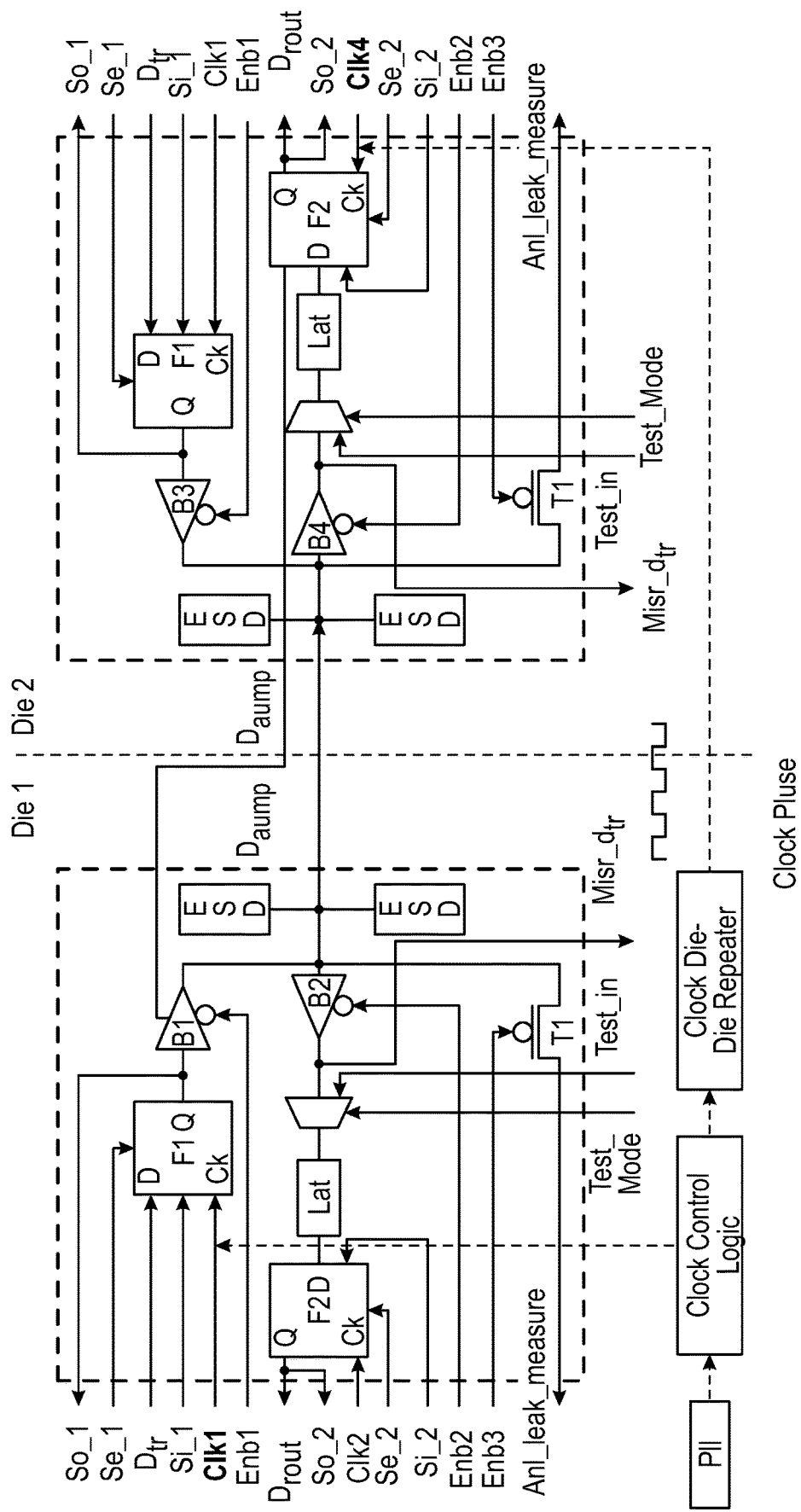
FIG. 7A is a diagram of one embodiment of source synchronous at-speed inter-die signal testing.

FIG. 7A is a diagram of one embodiment of source synchronous at-speed inter-die signal testing. Since the data D2DR cells may operate functionally at a much higher frequency than the TAP frequency, there is a need to screen for at-speed induced defects. Since most low-cost testers are hardware limited and unable to operate a very high speed, the embodiments perform at-speed loopback testing during the SORT test. During the CLASS test also, at-speed testing is used. For the CLASS test, the data is launched from the LFSR in the transmitting die and captured in the MISR in the receive die. The steps for both these at-speed tests are very similar and described herein below. The LFSR seeds will be loaded at TAP frequency. Then the data D2DR will switch over to source the clock from its native functional Phase Lock Loop (PLL) clock frequency to begin transmitting and receiving data at-speed respectively for F1 flip flop and F2 flip flop. Finally, the MISR value accumulated throughout the testing can be shifted out at TAP frequency.

Burn-in is one of the steps of high volume manufacturing where a manufactured part is stressed by running the part at a higher voltage and at an elevated temperature. During this process, the individual nodes of the D2DR cell have to be toggled. The DFT for the D2DR supports the toggling of the internal nodes of the D2DR during burn-in. In one example embodiment, a burn-in pattern shifts data (e.g., 1010 . . . ) through the ijtag_si input of the IJTAG infrastructure shown in FIG. 5. This bit stream traverses the L_SpkTDR and MISR_FLUSH_TDR. A circuit is added to ijtag_so to determine if ijtag_so is toggling and the input sequence (e.g., 1010 . . . ) is appearing or not. If either of these conditions is ever violated then the sticky error bit is set to 1. This can be read out at the end of the test via the uBump_C-TRL_TDR. To avoid contention at CLASS, two such tests are needed: one in which enb_tx is disabled in die1 and the second test in which enb_tx is disabled in die2.

The data D2DR and clock D2DR can be used in combination for source synchronous signals to traverse across the stack dies as shown in FIG. 7A. Hence, the illustrated setup can be used to perform at-speed testing across the die by using the clock D2DR to forward the native functional clock to launch and capture the transmitted data from Die 1 to Die 2 as in FIG. 7A. The LFSR values can be launched from Die 1 and the values captured by Die 2's MISR.

The at-speed interconnect test is controlled by a finite state machine (FSM) named, BIST_FSM. BIST_FSM can be programmed from the iJTAG interface to execute the test for a predetermined number of clock cycles. It also controls the clock multiplexing logic, described above, to provide the at-speed clock. The flow chart of FIG. 7C (discussed further below) describes the details of one embodiment of the BISP_FSM.

Figure 7B:
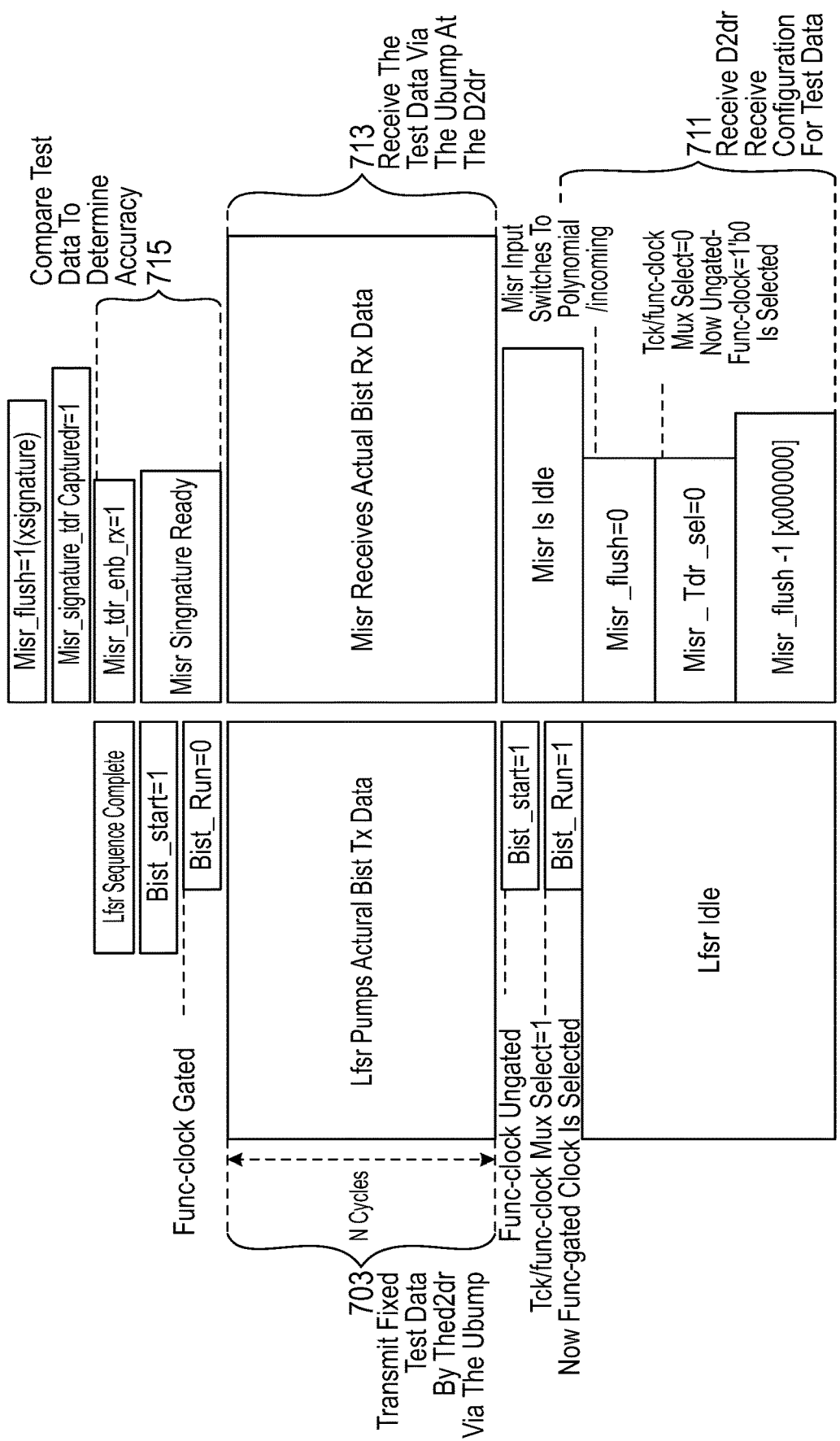
FIG. 7B is a flowchart of one embodiment of a source synchronous at-speed inter-die signal test.
Figure 7B:
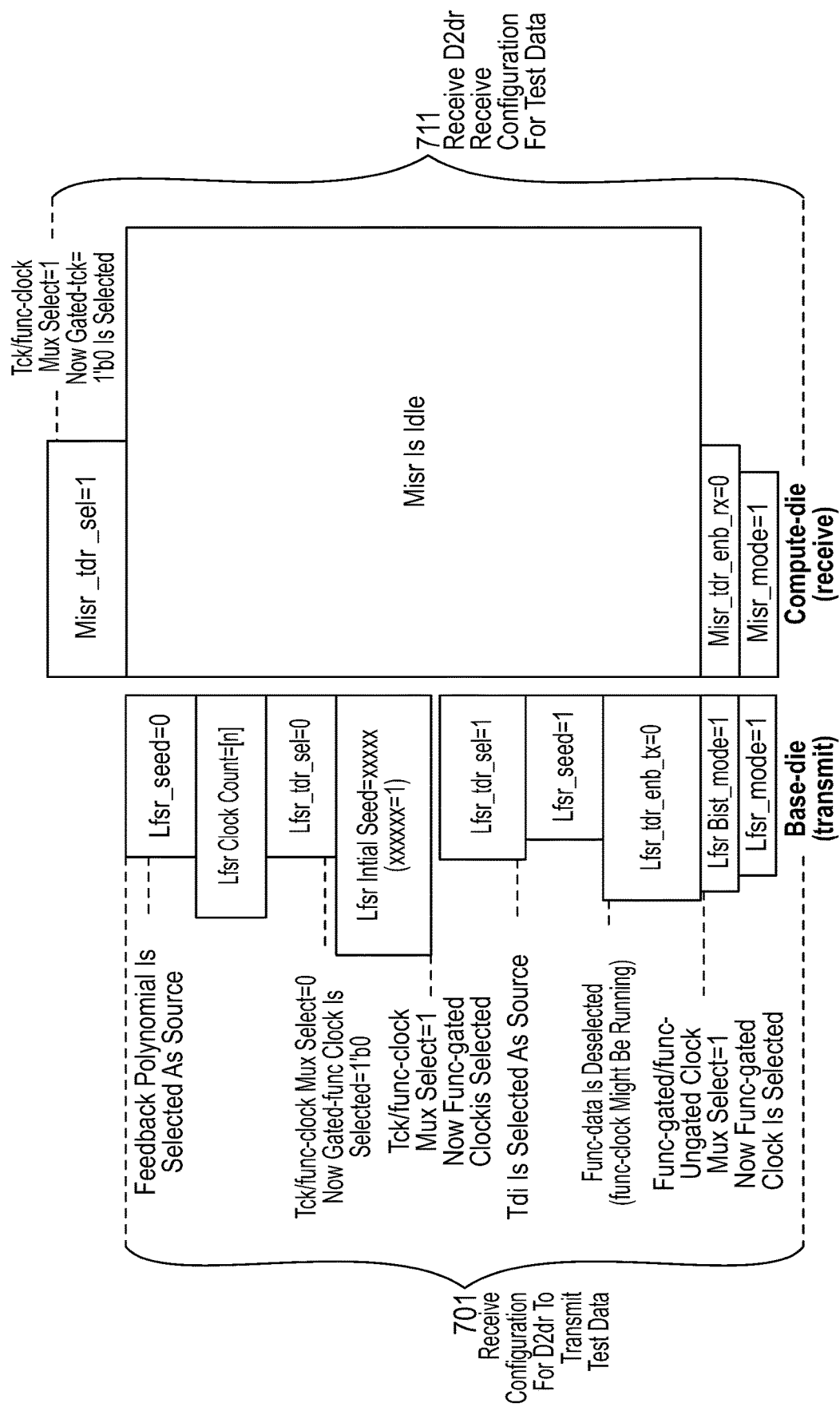

FIG. 7B is a flowchart of one embodiment of the source synchronous at-speed inter-die signal testing. The process may be initiated by a first die (Base Die), which transmits across the uBump to a second die (Compute Die). Each die can have the transmitting and receiving data and clock D2DRs as described above. The data to be transmitted for the test can be loaded via UTAG or similar interface into LFSR as part of the configuration of the first die (Block 701). In some embodiments, an LFSR_TDR is utilized along with a seed for the LFSR to prepare the data to be sent to the second die. The LFSR feeds data bit by bit to the transmitting circuitry which is configured to transmit the data across the uBump (Block 703). The buffer is enabled to transmit and the LFSR provides input for the data signal. The process can be initiated and stopped by setting a BIST_START and BIST_Run signal.

This data is received at the receive die via the uBump by the D2DR on the receive die (Block 713), which has been similarly configured to receive the test data (Block 711). The D2DR is configured to output the received test data, which may be output into a MISR or similar storage unit. The received data can be compared with an expected test pattern or the value of the sent test patter to validate the operation of the uBump as a connector (Block 715). In some embodiments, the received data is used to derive an MISR signature of or similar data to complete the test.

Figure 7C:
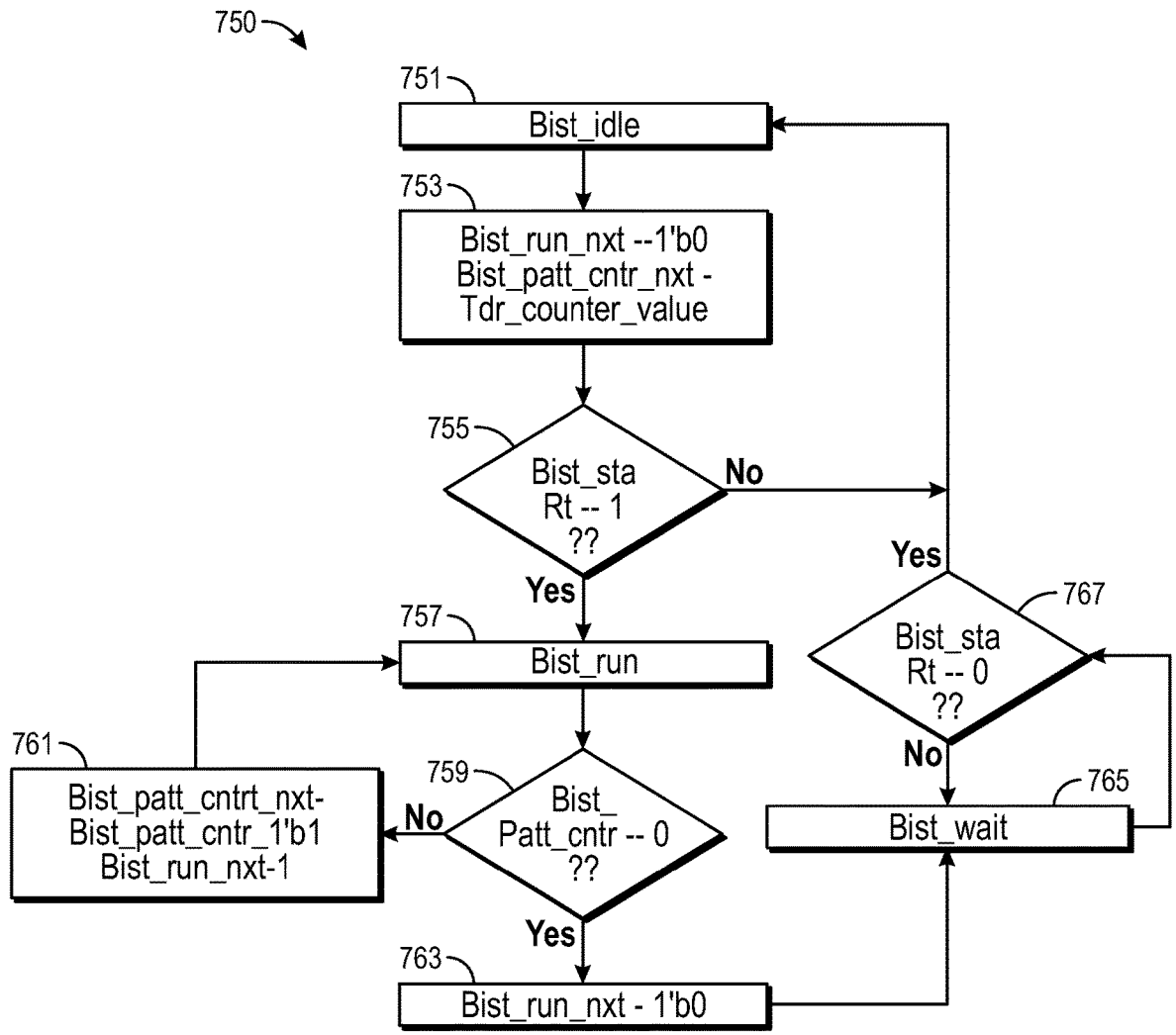
FIG. 7C is a flowchart of one embodiment of a built-in-self-test finite state machine.

FIG. 7C is a flowchart of one embodiment of the BIST FSM. The FSM on powerup begins in an idle state (Block 751). The process iterates through test patterns when an input signal/value initiates or continues the process. The next pattern is selected (Block 753) and a check is made wither the start bit is set (Block 755). If the start bit is not set then the process returns to idle (Block 751). If the start bit is set, then the state changes to the BIST_RUN (Block 757). The process checks whether pattern is set to a given value (Block 759), if not then the process sets the pattern value (Block 761). In one embodiment, the pattern is an indication of the number of iterations or clock cycles over which a test value or pattern is to be transmitted as part of the BIST process (e.g., the BIST_pttr_cntrl may represent the number of cycles/iterations). If the pattern is set to a given value, then the process sets the BIST_run_next to a fixed value (Block 712). The state transitions to BIST Wait and remains there until the start bit is cleared (Block 767). At this point the state returns to BIST idle state (Block 751).

Figure 8:
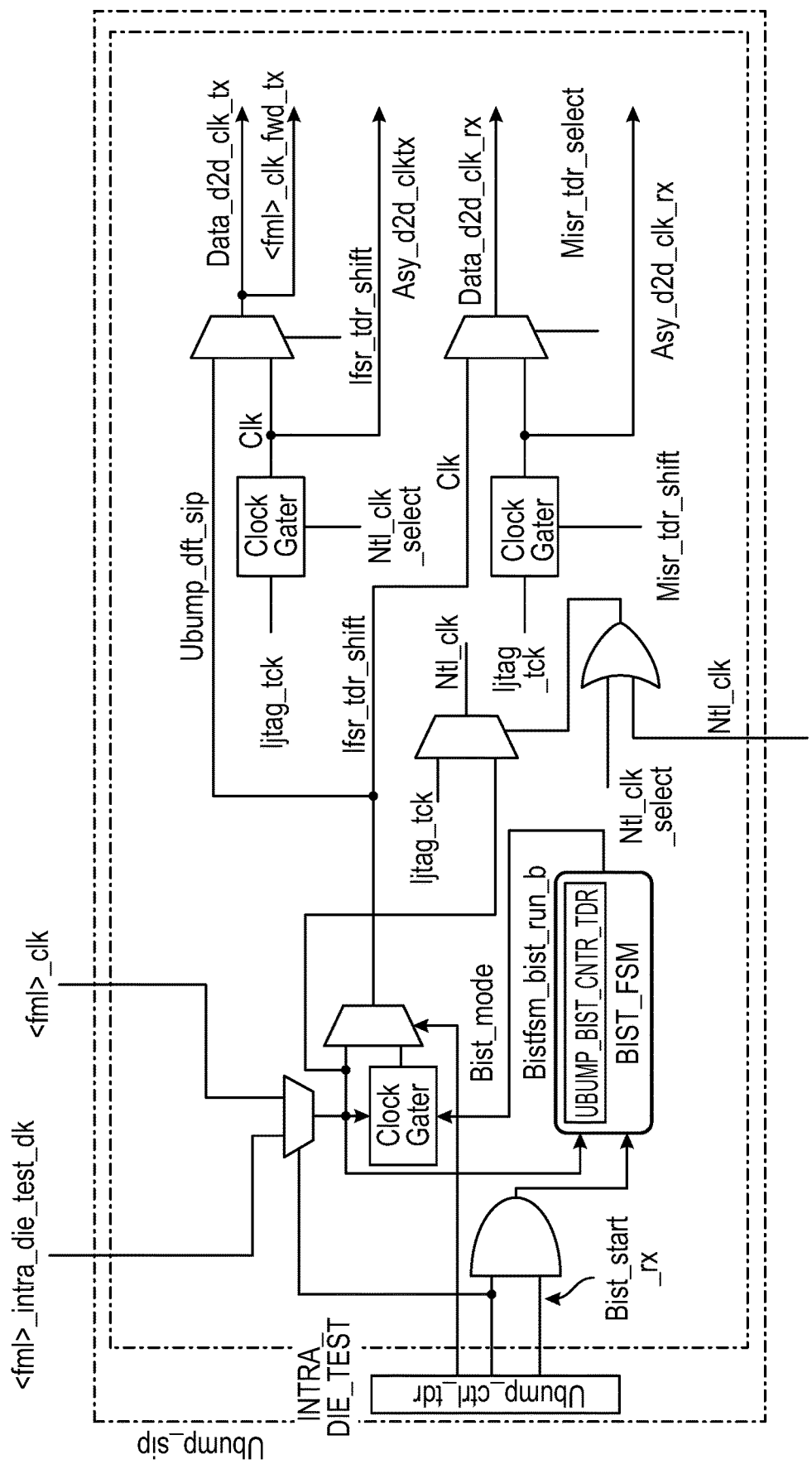
FIG. 8 is a diagram of one embodiment of a clock multiplexing logic for D2DRs.

FIG. 8 is a diagram of one embodiment of a clock multiplexing logic for D2DRs. This clock multiplexing logic derives the clock for the D2DR from different clock sources, viz. the <FML>_clk, used during the functional mode, tck, used during test, or similar circumstance. Note that the clk_tx and clk_rx signals input to the D2DR have to be generated from the SOC level functional clocks (<FML>_clk, in FIG. 8) and the SOC level TCK (ijtag_tck, in FIG. 8). The rest of the signals are test mode control signals that control the routing of these input clocks to the generated clocks named data_d2d_clk_tx, data_d2d_clk_rx, asy_d2d_clk_tx, and asy_d2d_clk_rx and <FML>_fwd_clk_tx. These are respectively, the clk_tx, clk_rx for the DATA D2DR cells in the same die; the clk_tx, clk_rx for the DFT logic in the ASY D2DR cells in the same die; and the forwarded clock to the receiving die. Note that, for SORT testing, when the receiving die does not have a clock source, we need a local clock for testing. <FML>_intra_die_test_clk is the test clock for SORT testing of the receiving die. The BIST_FSM is used to start and stop the at-speed test clock during at-speed testing. It also ensures that the LFSR and MISR are in synchrony.

With these embodiments of D2DR DFT methodology, there is no need to develop an inter-partition scan ATPG model to generate content for at-speed inter-die testing at CLASS. Time consuming efforts to develop a full chip model can be then mitigated. Instead the embodiments employ an approach of generating tester patterns that can be developed by pre-calculating the expected MISRs values at the receiving die by considering the user predefined LFSR input at the transmitter and the number of clock pulses being transmitted. The TAP sequence needed for the entire test setup can be predetermined thru this method without going thru any simulation and the calculated expected MISR value back-annotated into the tester patterns.

The embodiments relate to testing interconnects used between dies via a set of micro-bumps or similar connection points. These types of connections are one type of interconnect that is used in a computing device such as a processor, SoC or similar device. Certain electrical connections (e.g., couplings) include parallel conductors (e.g., parallel wires or other electrically conductive paths). The term electrical connection may generally refer to one or more separate physical connections, communication lines and/or interfaces, shared connections, and/or point-to-point connections, which may be connected by appropriate bridges, hubs, adapters, and/or controllers.

Figure 9:
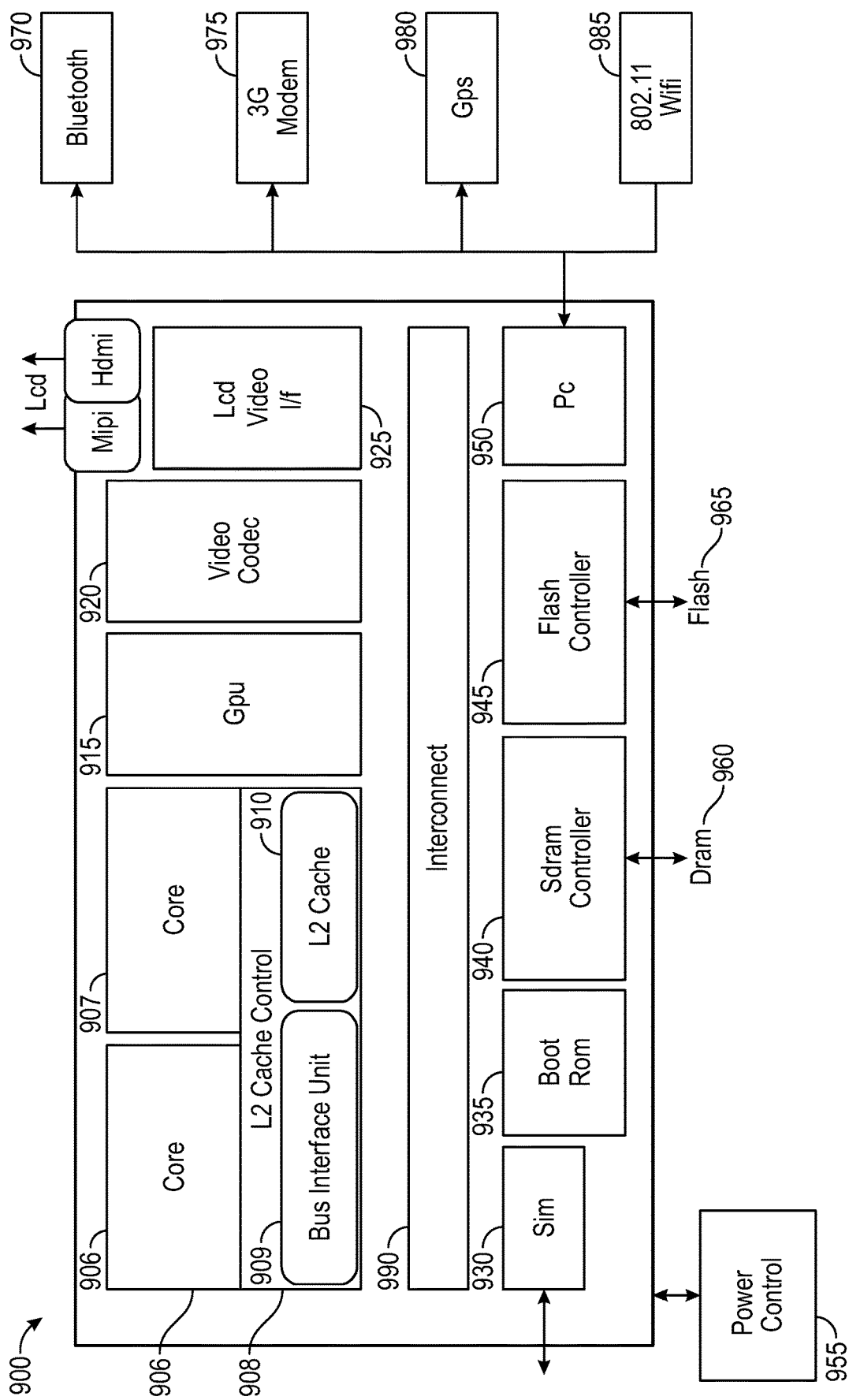
FIG. 9 illustrates a computing system on a chip according to embodiments of the disclosure.

Turning next to FIG. 9, an embodiment of a system on-chip (SOC) design in accordance with the embodiments is depicted. As a specific illustrative example, SOC 900 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 900 includes 2 cores-906 and 907. Similar to the discussion above, cores 906 and 907 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 906 and 907 are coupled to cache control 908 that is associated with bus interface unit 909 and L2 cache 910 to communicate with other parts of system 900. Interconnect 990 includes an on-chip interconnect, such as an IOSF, AMBA, or other interconnect discussed above, which potentially implements one or more aspects of the described embodiments. The cores 906 and 907 or similar components may be formed on a stacked set of dies and may be connected via a set of uBumps and may contain the DFT circuitry described herein to enable testing during the manufacturing process.

Interconnect 990 provides communication channels to the other components, such as a Subscriber Identity Module (SIM) 930 to interface with a SIM card, a boot ROM 935 to hold boot code for execution by cores 906 and 907 to initialize and boot SOC 900, a SDRAM controller 940 to interface with external memory (e.g. DRAM 960), a flash controller 945 to interface with non-volatile memory (e.g. Flash 965), a peripheral control 950 (e.g. Serial Peripheral Interface) to interface with peripherals, video codecs 920 and Video interface 925 to display and receive input (e.g. touch enabled input), GPU 915 to perform graphics related computations, etc. Any of these interfaces may incorporate aspects of the embodiments described herein.

In addition, the system illustrates peripherals for communication, such as a Bluetooth module 970, 3G modem 975, GPS 980, and WiFi 985. Note as stated above, a UE includes a radio for communication. As a result, these peripheral communication modules are not all required. However, in a UE some form a radio for external communication is to be included.

Note that the apparatus, methods, and systems described above may be implemented in any electronic device or system as aforementioned. As specific illustrations, the figures below provide exemplary systems for utilizing the embodiments as described herein. As the systems below are described in more detail, a number of different interconnects are disclosed, described, and revisited from the discussion above. And as is readily apparent, the advances described above may be applied to any of those interconnects, fabrics, or architectures.

Figure 10:
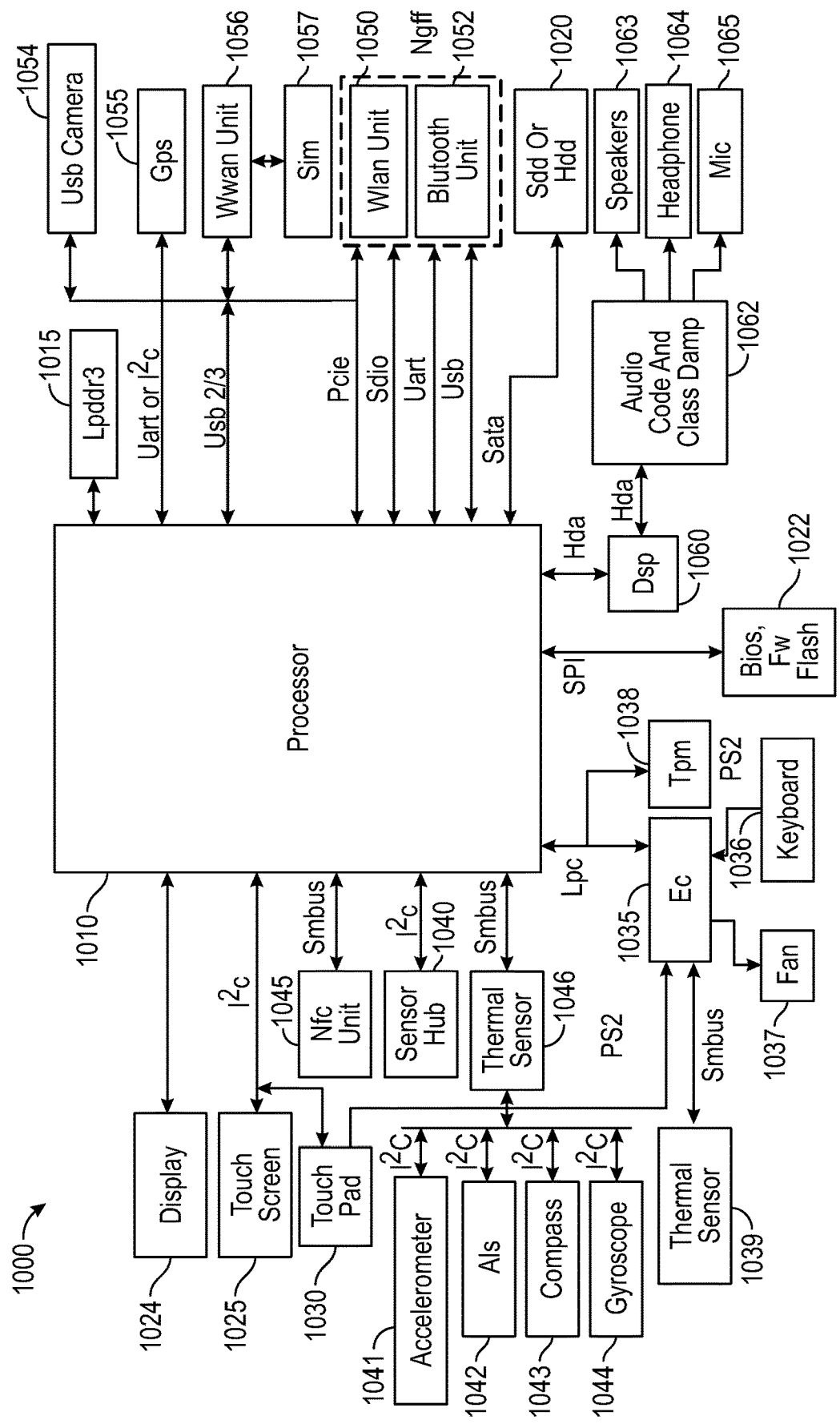
FIG. 10 illustrates an embodiment of a block diagram for a computing system.

Referring now to FIG. 10, a block diagram of components present in a computer system in accordance with embodiments of the disclosure is illustrated. As shown in FIG. 10, system 1000 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 10 is intended to show a high-level view of many components of the computer system. However, it is to be understood that some of the components shown may be omitted, additional components may be present, and different arrangement of the components shown may occur in other implementations. As a result, the embodiments described above may be implemented in any portion of one or more of the interconnects illustrated or described below.

As seen in FIG. 10, a processor 1010, in one embodiment, includes a microprocessor, multi-core processor, multi-threaded processor, an ultra-low voltage processor, an embedded processor, or other known processing element. In the illustrated implementation, processor 1010 acts as a main processing unit and central hub for communication with many of the various components of the system 1000. As one example, processor 1010 is implemented as a system on a chip (SoC). As a specific illustrative example, processor 1010 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitectural implementation may vary, but the architectural function of the processor is usually consistent. Certain details regarding the architecture and operation of processor 1010 in one implementation will be discussed further below to provide an illustrative example. The processor 1010 may incorporate components such as execution cores that are coupled as a stack of dies that communicate via the uBumps as discussed herein above.

Processor 1010, in one embodiment, communicates with a system memory 1015. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2011), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (Q17P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 1020 may also couple to processor 1010. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 10, a flash device 1022 may be coupled to processor 1010, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 1000. Specifically shown in the embodiment of FIG. 10 is a display 1024 which may be a high definition LCD or LED panel configured within a lid portion of the chassis. This display panel may also provide for a touch screen 1025, e.g., adapted externally over the display panel such that via a user's interaction with this touch screen, user inputs can be provided to the system to enable desired operations, e.g., with regard to the display of information, accessing of information and so forth. In one embodiment, display 1024 may be coupled to processor 1010 via a display interconnect that can be implemented as a high-performance graphics interconnect. Touch screen 1025 may be coupled to processor 1010 via another interconnect, which in an embodiment can be an I$^2$C interconnect. As further shown in FIG. 10, in addition to touch screen 1025, user input by way of touch can also occur via a touch pad 1030 which may be configured within the chassis and may also be coupled to the same I$^2$C interconnect as touch screen 1025.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920×1080p), be compatible with an embedded display port (eDP), and be a low power panel with panel self-refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass' or Gorilla Glass 2') for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 1010 in different manners. Certain inertial and environmental sensors may couple to processor 1010 through a sensor hub 1040, e.g., via an I$^2$C interconnect. In the embodiment shown in FIG. 10, these sensors may include an accelerometer 1041, an ambient light sensor (ALS) 1042, a compass 1043 and a gyroscope 1044. Other environmental sensors may include one or more thermal sensors 1046 which in some embodiments couple to processor 1010 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra-idle power to enable applications to remain connected, e.g., to a cloudbased location, at very low power consumption. The platform can support 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Also seen in FIG. 10, various peripheral devices may couple to processor 1010 via a low pin count (LPC) interconnect. In the embodiment shown, various components can be coupled through an embedded controller (EC) 1035. Such components can include a keyboard 1036 (e.g., coupled via a PS2 interface), a fan 1037, and a thermal sensor 1039. In some embodiments, touch pad 1030 may also couple to EC 1035 via a PS2 interface. In addition, a security processor such as a trusted platform module (TPM) 1038 in accordance with the Trusted Computing Group (TCG) TPM Specification Version 1.2, dated Oct. 2, 2003, may also couple to processor 1010 via this LPC interconnect. However, understand the scope of the present disclosure is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with a Universal Serial Bus specification, with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 1000 can communicate with external devices in a variety of manners, including wirelessly. In the embodiment shown in FIG. 10, various wireless modules, each of which can correspond to a radio configured for a particular wireless communication protocol, are present. One manner for wireless communication in a short range such as a near field may be via a near field communication (NFC) unit 1045 which may communicate, in one embodiment with processor 1010 via an SMBus. Note that via this NFC unit 1045, devices in close proximity to each other can communicate. For example, a user can enable system 1000 to communicate with another (e.g.,) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 10, additional wireless units can include other short range wireless engines including a WLAN unit 1050 and a Bluetooth unit 1052. Using WLAN unit 1050, Wi-Fi™ communications in accordance with a given Institute of Electrical and Electronics Engineers (IEEE) 802.11 standard can be realized, while via Bluetooth unit 1052, short range communications via a Bluetooth protocol can occur. These units may communicate with processor 1010 via, e.g., a USB link or a universal asynchronous receiver transmitter (UART) link. Or these units may couple to processor 1010 via an interconnect according to a Peripheral Component Interconnect Express™ (PCIe™) protocol, e.g., in accordance with the PCI Express™ Specification Base Specification version 3.0 (published Nov. 10, 2010), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 1056 which in turn may couple to a subscriber identity module (SIM) 1057. In addition, to enable receipt and use of location information, a GPS module 1055 may also be present. Note that in the embodiment shown in FIG. 10, WWAN unit 1056 and an integrated capture device such as a camera module 1054 may communicate via a given USB protocol, e.g., USB 2.0 or 3.0 link, or a UART or I²C protocol. Again the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multi-function device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 1060, which may couple to processor 1010 via a high definition audio (HDA) link. Similarly, DSP 1060 may communicate with an integrated coder/decoder (CODEC) and amplifier 1062 that in turn may couple to output speakers 1063 which may be implemented within the chassis. Similarly, amplifier and CODEC 1062 can be coupled to receive audio inputs from a microphone 1065 which in an embodiment can be implemented via dual array microphones (such as a digital microphone array) to provide for high quality audio inputs to enable voice-activated control of various operations within the system. Note also that audio outputs can be provided from amplifier/CODEC 1062 to a headphone jack 1064. Although shown with these particular components in the embodiment of FIG. 10, understand the scope of the present disclosure is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 1010 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

In one embodiment, a sustain power plane can be used during some deep sleep states to power on the I/O pins for several I/O signals, such as the interface between the processor and a PCH, the interface with the external VR and the interface with EC 1035. This sustain power plane also powers an on-die voltage regulator that supports the on-board SRAM or other cache memory in which the processor context is stored during the sleep state. The sustain power plane is also used to power on the processor's wakeup logic that monitors and processes the various wakeup source signals.

During power management, while other power planes are powered down or off when the processor enters certain deep sleep states, the sustain power plane remains powered on to support the above-referenced components. However, this can lead to unnecessary power consumption or dissipation when those components are not needed. To this end, embodiments may provide a connected standby sleep state to maintain processor context using a dedicated power plane. In one embodiment, the connected standby sleep state facilitates processor wakeup using resources of a PCH which itself may be present in a package with the processor. In one embodiment, the connected standby sleep state facilitates sustaining processor architectural functions in the PCH until processor wakeup, this enabling turning off all of the unnecessary processor components that were previously left powered on during deep sleep states, including turning off all of the clocks. In one embodiment, the PCH contains a time stamp counter (TSC) and connected standby logic for controlling the system during the connected standby state. The integrated voltage regulator for the sustain power plane may reside on the PCH as well.

In an embodiment, during the connected standby state, an integrated voltage regulator may function as a dedicated power plane that remains powered on to support the dedicated cache memory in which the processor context is stored such as critical state variables when the processor enters the deep sleep states and connected standby state. This critical state may include state variables associated with the architectural, micro-architectural, debug state, and/or similar state variables associated with the processor.

The wakeup source signals from EC 1035 may be sent to the PCH instead of the processor during the connected standby state so that the PCH can manage the wakeup processing instead of the processor. In addition, the TSC is maintained in the PCH to facilitate sustaining processor architectural functions. Although shown with these particular components, understand the scope of the present disclosure is not limited in this regard.

Power control in the processor can lead to enhanced power savings. For example, power can be dynamically allocated between cores, individual cores can change frequency/voltage, and multiple deep low power states can be provided to enable very low power consumption. In addition, dynamic control of the cores or independent core portions can provide for reduced power consumption by powering off components when they are not being used.

Some implementations may provide a specific power management IC (PMIC) to control platform power. Using this solution, a system may see very low (e.g., less than 5%) battery degradation over an extended duration (e.g., 16 hours) when in a given standby state, such as when in a Win8 Connected Standby state. In a Win8 idle state a battery life exceeding, e.g., 9 hours may be realized (e.g., at 150 nits). As to video playback, a long battery life can be realized, e.g., full HD video playback can occur for a minimum of 6 hours. A platform in one implementation may have an energy capacity of, e.g., 35 watt hours (Whr) for a Win8 CS using an SSD and (e.g.,) 40-44Whr for Win8 CS using an HDD with a RST cache configuration.

A particular implementation may provide support for 15 W nominal CPU thermal design power (TDP), with a configurable CPU TDP of up to approximately 25 W TDP design point. The platform may include minimal vents owing to the thermal features described above. In addition, the platform is pillow-friendly (in that no hot air is blowing at the user). Different maximum temperature points can be realized depending on the chassis material. In one implementation of a plastic chassis (at least having to lid or base portion of plastic), the maximum operating temperature can be 52 degrees Celsius (C). And for an implementation of a metal chassis, the maximum operating temperature can be 46° C.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TXT), and Intel® Manageability Engine Technology along with secure user interfaces such as a secure keyboard and display.

Figure 11:
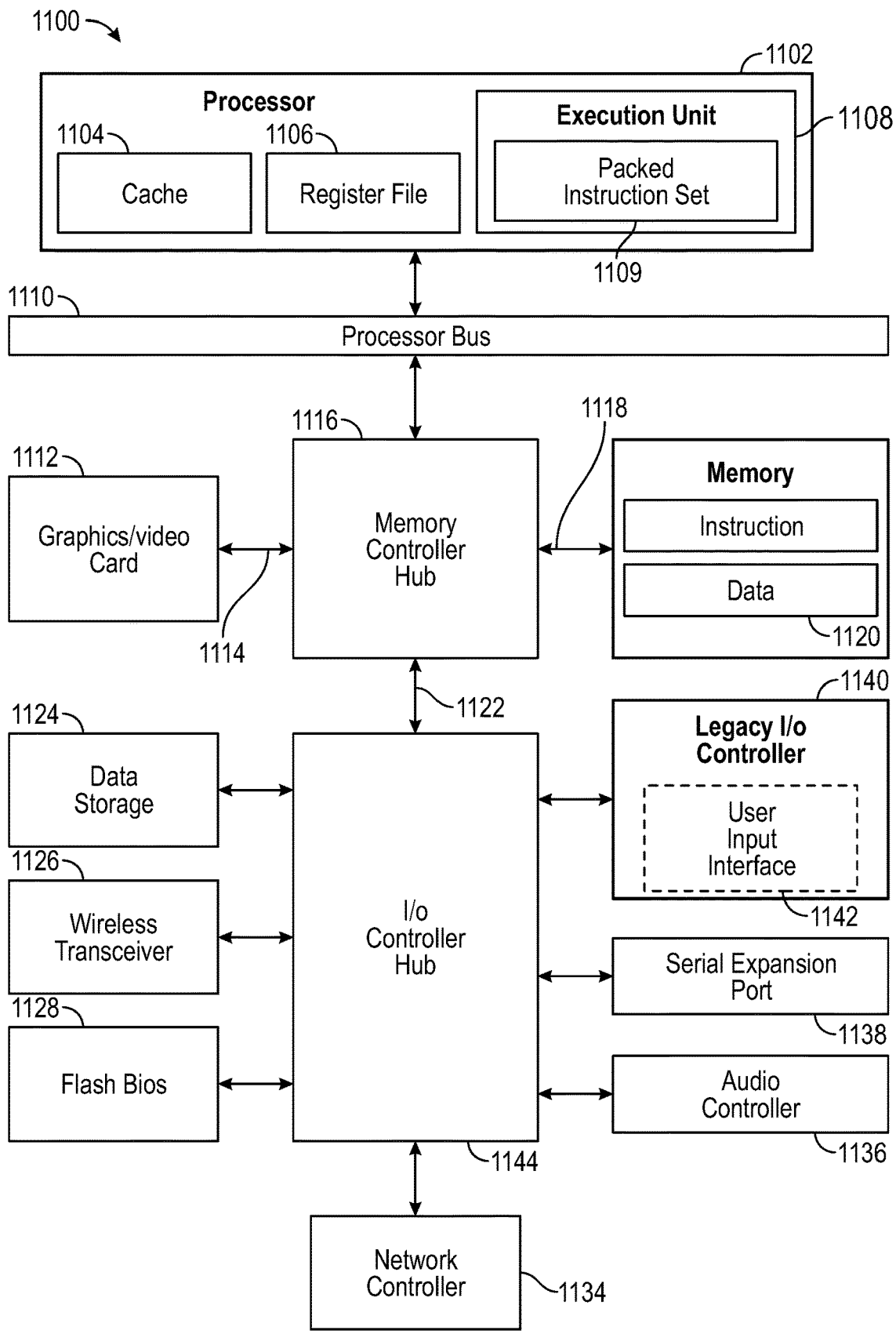
FIG. 11 illustrates another embodiment of a block diagram for a computing system.

Turning to FIG. 11, a block diagram of an exemplary computer system formed with a processor that includes execution units to execute an instruction, where one or more of the interconnects implement one or more features in accordance with embodiments of the disclosure is illustrated. System 1100 includes a component, such as a processor 1102 to employ execution units including logic to perform algorithms for process data, in accordance with the present disclosure, such as in the embodiment described herein. System 1100 is representative of processing systems based on the PENTIUM III™, PENTIUM 4™, Xeon™, Itanium, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 1100 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present disclosure are not limited to any specific combination of hardware circuitry and software.

Embodiments are not limited to computer systems. Alternative embodiments of the present disclosure can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1102 includes one or more execution units 1108 to implement an algorithm that is to perform at least one instruction. One embodiment may be described in the context of a single processor desktop or server system, but alternative embodiments may be included in a multiprocessor system. System 1100 is an example of a 'hub' system architecture. In some embodiments, the components of processor 1102 may be formed as a stacked set of dies coupled via uBumps or similar mechanisms and may incorporate the DFT embodiments described herein above. The computer system 1100 includes a processor 1102 to process data signals. The processor 1102, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1102 is coupled to a processor bus 1110 that transmits data signals between the processor 1102 and other components in the system 1100. The elements of system 1100 (e.g. graphics accelerator 1112, memory controller hub 1116, memory 1120, I/O controller hub 1144, wireless transceiver 1126, Flash BIOS 1128, Network controller 1134, Audio controller 1136, Serial expansion port 1138, I/O controller 1140, etc.) perform their conventional functions that are well known to those familiar with the art.

In one embodiment, the processor 1102 includes a Level 1 (L1) internal cache memory 1104. Depending on the architecture, the processor 1102 may have a single internal cache or multiple levels of internal caches. Other embodiments include a combination of both internal and external caches depending on the particular implementation and needs. Register file 1106 is to store different types of data in various registers including integer registers, floating point registers, vector registers, banked registers, shadow registers, checkpoint registers, status registers, and instruction pointer register.

Execution unit 1108, including logic to perform integer and floating-point operations, also resides in the processor 1102. The processor 1102, in one embodiment, includes a microcode (µcode) ROM to store microcode, which when executed, is to perform algorithms for certain macroinstructions or handle complex scenarios. Here, microcode is potentially updateable to handle logic bugs/fixes for processor 1102. For one embodiment, execution unit 1108 includes logic to handle a packed instruction set 1109. By including the packed instruction set 1109 in the instruction set of a general-purpose processor 1102, along with associated circuitry to execute the instructions, the operations used by many multimedia applications may be performed using packed data in a general-purpose processor 1102. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1108 may also be used in micro controllers, embedded processors, graphics devices, DSPs, and other types of logic circuits. System 1100 includes a memory 1120. Memory 1120 includes a dynamic random-access memory (DRAM) device, a static random-access memory (SRAM) device, flash memory device, or other memory device. Memory 1120 stores instructions and/or data represented by data signals that are to be executed by the processor 1102.

Note that any of the aforementioned features or aspects of the embodiments of the disclosure may be utilized on one or more interconnect illustrated in FIG. 11. For example, an on-die interconnect (ODI), which is not shown, for coupling internal units of processor 1102 implements one or more aspects of the disclosure herein. Or the embodiments of the disclosure are associated with a processor bus 1110 (e.g. Intel Quick Path Interconnect (QPI) or other known high-performance computing interconnect), a high bandwidth memory path 1118 to memory 1120, a point-to-point link 1114 to graphics accelerator 1112 (e.g. a Peripheral Component Interconnect express (PCIe) compliant fabric), a controller hub interconnect 1122, an I/O or other interconnect (e.g. USB, PCI, PCIe) for coupling the other illustrated components. Some examples of such components include the audio controller 1136, firmware hub (flash BIOS) 1128, wireless transceiver 1126, data storage 1124, legacy I/O controller 1110 containing user input and keyboard interfaces 1142, a serial expansion port 1138 such as Universal Serial Bus (USB), and a network controller 1134. The data storage device 1124 can comprise a hard disk drive, a floppy disk drive, a CD-ROM device, a flash memory device, or other mass storage device.

Figure 12:
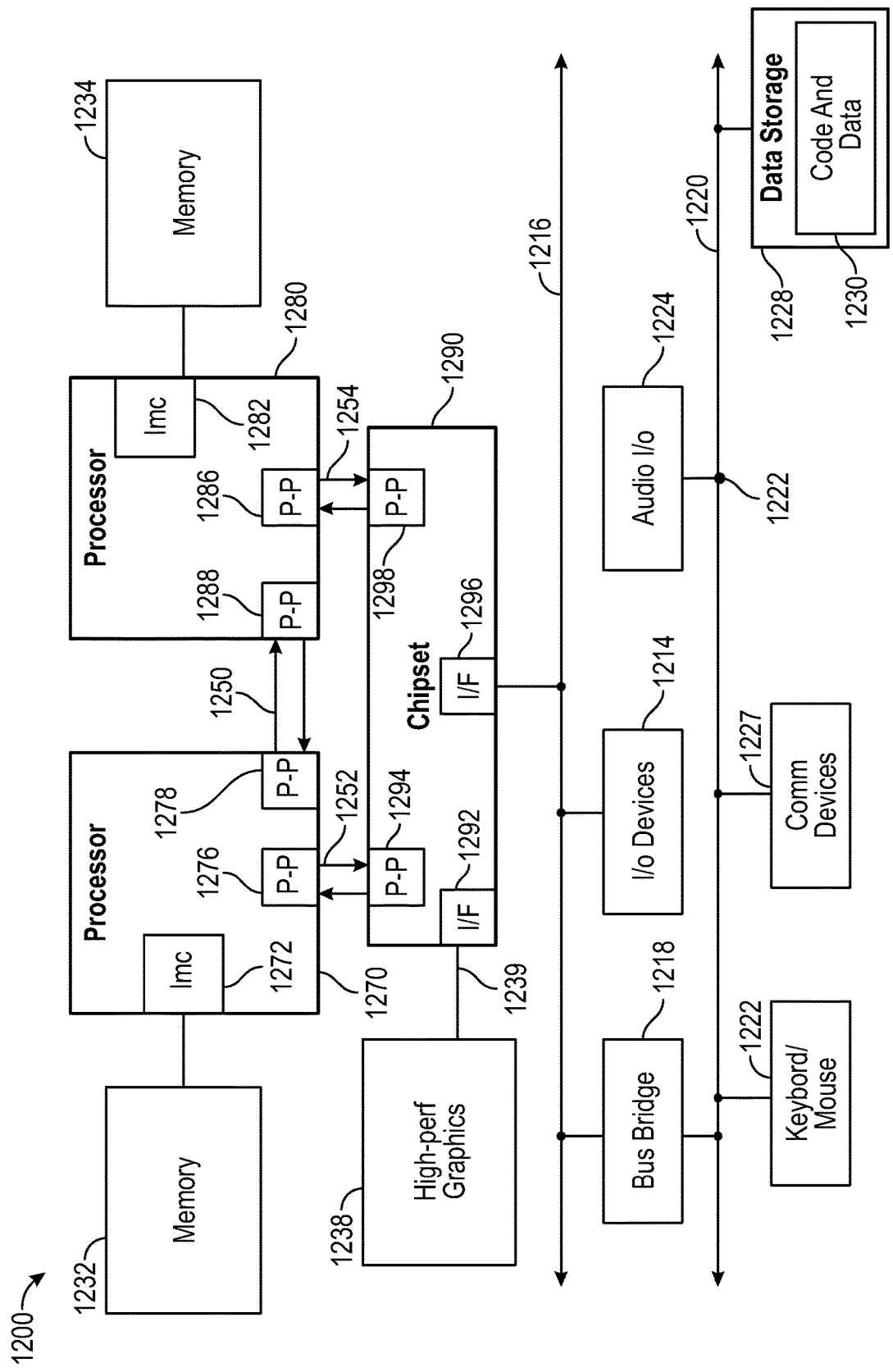
FIG. 12 illustrates another embodiment of a block diagram for a computing system.

Referring now to FIG. 12, shown is a block diagram of a second system 1200 in accordance with an embodiment of the present disclosure. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of a processor. In one embodiment, 1252 and 1254 are part of a serial, point-to-point coherent interconnect fabric, such as Intel's Quick Path Interconnect (QPI) architecture. As a result, embodiments of the disclosure may be implemented within the QPI architecture. In other embodiments the multiprocessor system 1200 includes processors 1270 and 1280 that are formed as a set of stacked dies that are communicatively coupled via uBumps or similar mechanisms and may incorporate the DFT mechanisms described herein above.

While shown with only two processors 1270, 1280, it is to be understood that the scope of the present disclosure is not so limited. In other embodiments, one or more additional processors may be present in a given processor.

Processors 1270 and 1280 are shown including integrated memory controller units 1272 and 1282, respectively. Processor 1270 also includes as part of its bus controller unit's point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 each exchange information with a chipset 1290 via individual P-P interfaces 1252, 1254 using point to point interface circuits 1276, 1294, 1286, 1298. Chipset 1290 also exchanges information with a high-performance graphics circuit 1238 via an interface circuit 1292 along a high-performance graphics interconnect 1239.

A shared cache (not shown) may be included in either processor or outside of both processors; yet connected with the processors via P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present disclosure is not so limited.

As shown in FIG. 12, various I/O devices 1214 are coupled to first bus 1216, along with a bus bridge 1218 which couples first bus 1216 to a second bus 1220. In one embodiment, second bus 1220 includes a low pin count (LPC) bus. Various devices are coupled to second bus 1220 including, for example, a keyboard and/or mouse 1222, communication devices 1227 and a storage unit 1228 such as a disk drive or other mass storage device which often includes instructions/code and data 1230, in one embodiment. Further, an audio I/O 1224 is shown coupled to second bus 1220. Note that other architectures are possible, where the included components and interconnect architectures vary. For example, instead of the point-to-point architecture of FIG. 12, a system may implement a multi-drop bus or other such architecture.

Embodiments (e.g., of the mechanisms) disclosed herein may be implemented in hardware (e.g., a computer programmed to perform a method may be as described in the detailed description), software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code may be executed to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. The mechanisms described herein are not limited in scope to any particular programming language. The language may be a compiled or interpreted language.

One or more aspects of at least one embodiment may be implemented by representative instructions stored on a non-transitory, machine-readable medium which represents various logic within the processor, which when read by a machine causes the machine to fabricate logic to perform the techniques described herein. Such representations, which may be generally referred to as "IP cores" may be stored on a tangible, machine readable medium and supplied to various customers or manufacturing facilities to load into the fabrication machines that make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Example embodiments include a die-to-die repeater circuit including a transmit circuit coupled to a die-to-die interconnect, the transmit circuit including at least one flip flop to function as a part of a linear feedback shift register (LFSR) to transmit a value across the die-to-die interconnect for design for test (DFT) to check proper operation of the die-to-die interconnect, and a receive circuit coupled to the die-to-die interconnect, the receive circuit including at least one flip flop to function as part of a multiple input shift register (MISR).

The die-to-die repeater circuit further includes, in some embodiments, a transmit buffer coupled between the flip flop and die-to-die interconnect of the transmit circuit, and a receive buffer coupled between the flip flop and die-to-die interconnect of the receive circuit, an internal joint test action group (UTAG) interface coupled to the transmit circuit and the receive circuit configured the die-to-die repeater circuit for DFT function, a clock control circuit to manage a clock signal of the transmit circuit and a receive circuit of another die-to-die repeater coupled to the die-to-die interconnect, a clock die-to-die repeater coupled to the die-to-die interconnect to drive a clock signal across the die-to-die interconnect. a built-in-self-test (BIST) finite state machine (FSM) coupled to the transmit circuit and receive circuit to manage a DFT test, where the DFT test is any one of a no touch leakage (NTL) test, a parametric test or an at-speed test, where the flip flop is a D flip flop, a transistor coupled to the die-to-die interconnect to manage transmission or receiving of asynchronous signals.

In some embodiments, a system includes a memory device, a bus, and a three-dimensional integrated circuit coupled to the memory device and bus, the three-dimensional integrated circuit including, a die-to-die interconnect to enable communication between stacked dies, a first die including a first die-to-die repeater to perform design for test (DFT) functions across the die-to-die interconnect, and a second die including a second die-to-die repeater to perform DFT functions across the die-to-die interconnect. The system further includes a transmit circuit coupled to the die-to-die interconnect, the transmit circuit to drive a test value across the die-to-die interconnect, where the second die-to-die repeater includes a receive circuit coupled to the die-to-die interconnect, the receive circuit to receive and validate a test value over the die-to-die interconnect, a linear feedback shift register (LFSR) on the first die to generate a value to be transmitted across the die-to-die interconnect, wherein the first die-to-die repeater is a part of the LFSR, a multiple input shift register (MISR) in the second die to receive a test value and generate a MISR signature, wherein the second die-to-die repeater is a part of the MISR, an internal joint test action group (IJTAG) interface coupled to the first die or the second die having a plurality of test data registers (TDRs) to store test configuration information. a clock control circuit including a built-in-self-test (BIST) finite state machine (FSM) to manage a mode of the first die-to-die repeater circuit or the second die-to-die repeater circuit, wherein the DFT function is any one of a no touch leakage (NTL) test, a parametric test or an at-speed test, wherein the die-to-die repeater includes a data cell and a clock cell.

In some embodiments, a die-to-die repeater circuit includes a transmit means coupled to a die-to-die interconnect, the transmit means to function to transmit a test value across the die-to-die interconnect for design for test (DFT) to check proper operation of the die-to-die interconnect as part of a built-in self-test (BIST), and a receive means coupled to the die-to-die interconnect, the receive means to capture another test value across the die-to-die interconnect to verify the operation of the die-to-die interconnect, wherein the transmit means includes a transmit buffer to store the test value before transmission, wherein the receive means includes a receive buffer to store the another test value, an internal joint test action group (IJTAG) interface coupled to the transmit means and the receive means, the IJTAG interface to configure the die-to-die repeater circuit for DFT function, a clock control circuit to manage a clock signal of the transmit means and a receive means of another die-to-die repeater coupled to the die-to-die interconnect, a clock die-to-die repeater coupled to the die-to-die interconnect to drive a clock signal across the die-to-die interconnect, a BIST finite state machine (FSM) coupled to the transmit means and receive means to manage a DFT test, where the DFT test is any one of a no touch leakage (NTL) test, a parametric test or an at-speed test, wherein the transmit means or receive means include a D flip flop, and a transistor coupled to the die-to-die interconnect to manage transmission or receiving of asynchronous signals.

Accordingly, embodiments of the disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

What is claimed is:

1. A die-to-die repeater circuit comprising:
    a transmit circuit in a die, the transmit circuit coupled to a micro bump of a die-to-die interconnect, the transmit circuit including at least one flip flop to function as a part of a linear feedback shift register (LFSR) to transmit a value across the die-to-die interconnect for design for test (DFT) to check proper operation of the die-to-die interconnect; and
    a receive circuit in the die, the receive circuit coupled to the micro bump of the die-to-die interconnect, the receive circuit including at least one flip flop to function as part of a multiple input shift register (MISR).

2. The die-to-die repeater circuit of claim 1, further comprising:
    a transmit buffer coupled between the flip flop and die-to-die interconnect of the transmit circuit; and
    a receive buffer coupled between the flip flop and die-to-die interconnect of the receive circuit.

3. The die-to-die repeater circuit of claim 1, further comprising:
    an internal joint test action group interface (IJTAG) coupled to the transmit circuit and the receive circuit configured the die-to-die repeater circuit for DFT function.

4. The die-to-die repeater circuit of claim 1, further comprising:
    a clock control circuit to manage a clock signal of the transmit circuit and a receive circuit of another die-to-die repeater coupled to the die-to-die interconnect.

5. The die-to-die repeater circuit of claim 4, further comprising:
    a clock die-to-die repeater coupled to the die-to-die interconnect to drive a clock signal across the die-to-die interconnect.

6. The die-to-die repeater circuit of claim 1, further comprising:
    a built-in-self-test (BIST) finite state machine (FSM) coupled to the transmit circuit and receive circuit to manage a DFT test.

7. The die-to-die repeater circuit of claim 6, wherein the DFT test is any one of a no touch leakage (NTL) test, a parametric test or an at-speed test.

8. The die-to-die repeater circuit of claim 1, wherein the flip flop is a D flip flop.

9. The die-to-die repeater circuit of claim 1, further comprising:
    a transistor coupled to the die-to-die interconnect to manage transmission or receiving of asynchronous signals.

* * * * *